(12) United States Patent
Radivojevic et al.

(10) Patent No.: US 9,495,010 B2
(45) Date of Patent: Nov. 15, 2016

(54) APPARATUS AND ASSOCIATED METHODS

(75) Inventors: Zoran Radivojevic, Cambridge (GB);
Paul Beecher, Cambridge (GB); Chris Bower, Ely (GB); Piers Andrew, Cambridge (GB); Darryl Cotton, Cambs (GB); Samiul Haque, Cambridge (GB)

(73) Assignee: Nokia Technologies Oy, Espoo (FI)

( * ) Notice: Subject to any disclaimer, the term of this patent is extended or adjusted under 35 U.S.C. 154(b) by 433 days.

(21) Appl. No.: 13/587,492

(22) Filed: Aug. 16, 2012

(65) Prior Publication Data

US 2013/0106774 A1    May 2, 2013

Related U.S. Application Data

(63) Continuation-in-part of application No. 13/281,776, filed on Oct. 26, 2011.

(51) Int. Cl.
*G06F 3/045* (2006.01)
*G06F 3/01* (2006.01)
(Continued)

(52) U.S. Cl.
CPC ............ *G06F 3/016* (2013.01); *G06F 3/044* (2013.01); *G06F 3/0416* (2013.01); *G06F 3/0418* (2013.01); *H03K 17/962* (2013.01);
(Continued)

(58) Field of Classification Search
CPC ...... G06F 3/044; G06F 3/016; G06F 3/0416; H03K 17/962; H03K 2017/9606; H03K 2017/9613; H03K 2217/969765; H03K 2017/06077; H03K 2017/969775
USPC ........................................................ 345/174
See application file for complete search history.

(56) References Cited

U.S. PATENT DOCUMENTS 5,457,289 A    10/1995  Huang et al. .................... 178/20
5,543,588 A *   8/1996  Bisset et al. ............... 178/18.06
(Continued)

FOREIGN PATENT DOCUMENTS

EP    2112576 A    10/2009
EP    2354901 A1    8/2011
(Continued)

OTHER PUBLICATIONS

Reverter, et al., "Stability and Accuracy of Active Shielding for Grounded Capacitive Sensors", Institute of Physics Publishing, (Sep. 28, 2006), (pp. 2884-2890).
(Continued)

*Primary Examiner* — Mark Regn
(74) *Attorney, Agent, or Firm* — Harrington & Smith

(57) ABSTRACT

An apparatus including a processor and a memory including computer program code. The memory and the computer program code are configured to cause the apparatus to, for an array of capacitive touch sensors with a proximally positioned electrotactile layer, compare the capacitance associated with a capacitive touch sensor of the array against a respective detection threshold to determine whether or not a touch input has occurred at the capacitive touch sensor by a stylus in capacitive coupling proximity to the capacitive touch sensor. The detection threshold of one or more capacitive touch sensors of the array is set to be sufficient to inhibit the erroneous generation of a touch input signal at the one or more respective capacitive touch sensors caused by capacitive cross-coupling, via the electrotactile layer, to the capacitive touch sensor which is in capacitive coupling proximity to the stylus.

15 Claims, 15 Drawing Sheets

(51) Int. Cl.
*G06F 3/044* (2006.01)
*G06F 3/041* (2006.01)
*H03K 17/96* (2006.01)

(52) U.S. Cl.
CPC ............. *H03K2017/9606* (2013.01); *H03K 2017/9613* (2013.01); *H03K 2217/96077* (2013.01); *H03K 2217/960765* (2013.01); *H03K 2217/960775* (2013.01)

(56) References Cited

U.S. PATENT DOCUMENTS

| | | | |
|---|---|---|---|
| 2004/0155871 A1 | 8/2004 | Perski et al. | 345/174 |
| 2007/0171211 A1* | 7/2007 | Perski et al. | 345/173 |
| 2007/0222762 A1 | 9/2007 | Van Delden et al. | 345/173 |
| 2008/0158176 A1* | 7/2008 | Land | G06F 3/0418 345/173 |
| 2008/0158178 A1 | 7/2008 | Hotelling et al. | 345/173 |
| 2010/0013791 A1 | 1/2010 | Haga et al. | 345/174 |
| 2010/0085169 A1* | 4/2010 | Poupyrev | G06F 3/03543 340/407.2 |
| 2010/0152794 A1* | 6/2010 | Radivojevic et al. | 607/2 |
| 2010/0156795 A1 | 6/2010 | Kim et al. | 345/168 |
| 2010/0200309 A1 | 8/2010 | Yilmaz et al. | 178/18.03 |
| 2010/0201650 A1 | 8/2010 | Son | 345/174 |
| 2010/0252335 A1 | 10/2010 | Orsley | 178/18.03 |
| 2010/0259503 A1 | 10/2010 | Yanase et al. | 345/174 |
| 2010/0302182 A1 | 12/2010 | Wei et al. | 345/173 |
| 2010/0309162 A1 | 12/2010 | Nakanishi et al. | 345/174 |
| 2010/0321328 A1 | 12/2010 | Chang et al. | 345/174 |
| 2011/0074609 A1 | 3/2011 | Lin | 341/33 |
| 2011/0074733 A1 | 3/2011 | Mäkinen et al. | 345/174 |
| 2011/0109588 A1 | 5/2011 | Makinen et al. | |
| 2011/0148435 A1 | 6/2011 | Schwartz et al. | 324/658 |
| 2011/0148809 A1 | 6/2011 | Kanehira et al. | |
| 2011/0156930 A1* | 6/2011 | Chen et al. | 341/33 |
| 2011/0254799 A1 | 10/2011 | Makinen et al. | 345/173 |
| 2011/0298758 A1 | 12/2011 | Hsieh | |
| 2012/0075221 A1 | 3/2012 | Yasuda | 345/173 |
| 2012/0194466 A1 | 8/2012 | Posamentier | 345/174 |
| 2012/0274599 A1 | 11/2012 | Schediwy | |

FOREIGN PATENT DOCUMENTS

| | | |
|---|---|---|
| EP | 2482164 A1 | 8/2012 |
| GB | 2462112 A | 1/2010 |
| GB | 2478765 A | 9/2011 |
| WO | WO-2009056784 A1 | 5/2009 |

OTHER PUBLICATIONS

AD7142, "Theory of Operation", (2007), (5 pages).
AD7147, Analog Services, "CapTouch Programmable Controller for Single-Electrode Capacitance Sensors", (2007), (72 pages).

* cited by examiner

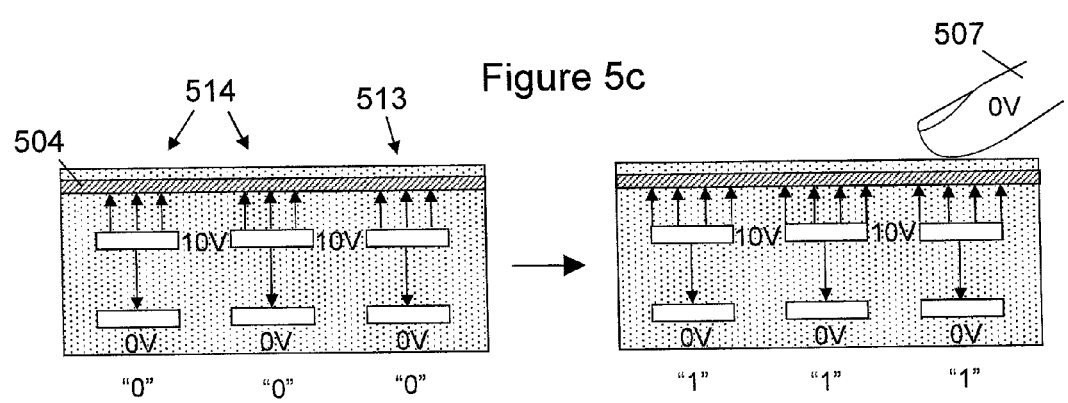
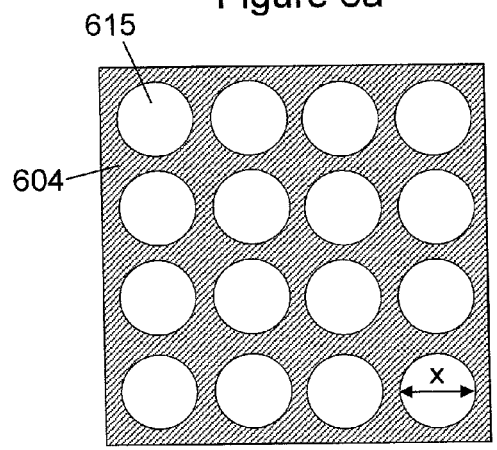
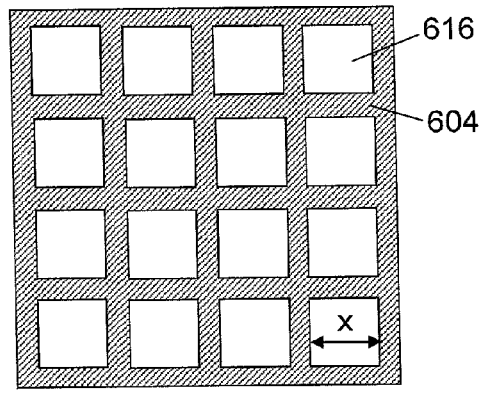
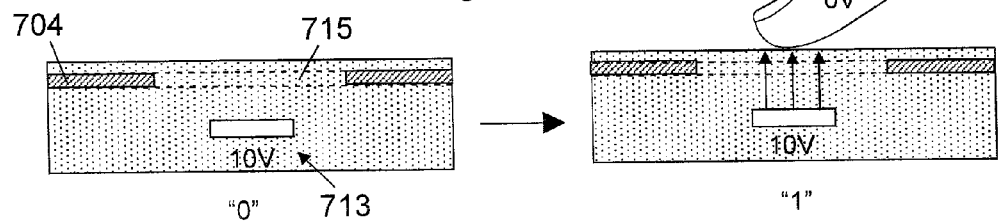

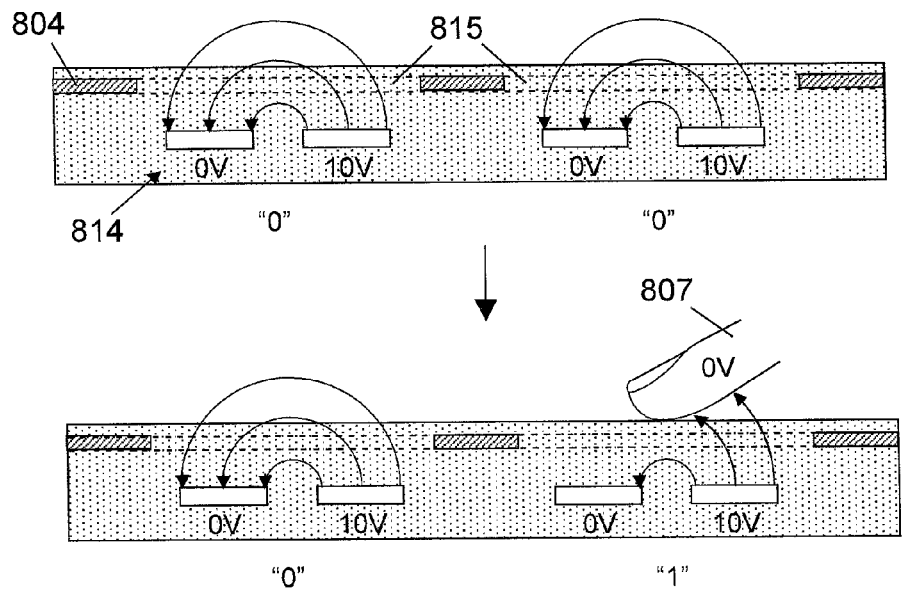
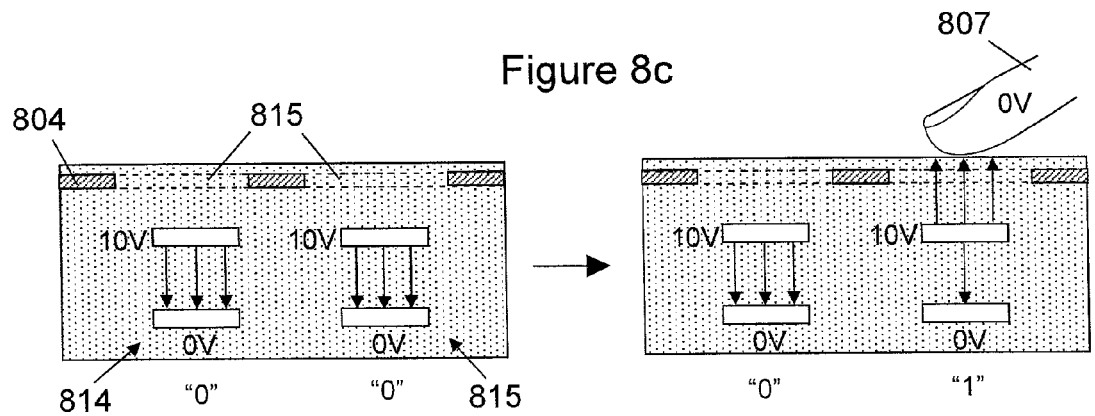

Figure 17(b)
Set the same detection threshold for each capacitive touch sensor

Figure 17(c)
Set the detection threshold different for one capacitive touch sensor from another capacitive touch sensor

Figure 17(d)
Set the detection threshold based on a peak capacitance

Figure 17(e)
Set the detection threshold determined using a calibration application

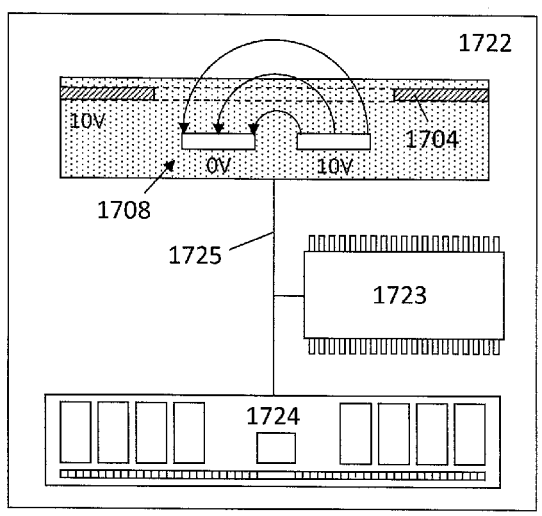

1826 — Set the detection threshold of the capacitive touch sensors to inhibit the erroneous generation of a touch input signal caused by capacitive cross-coupling 1827 — Compare the capacitance associated with the touch sensors against the detection threshold to determine whether or not a touch input has occurred

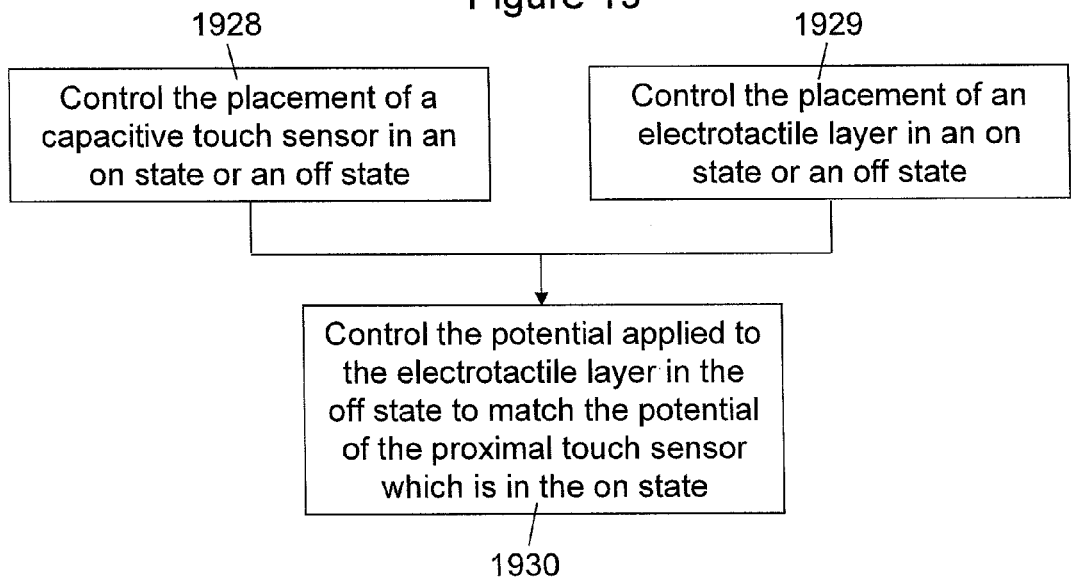
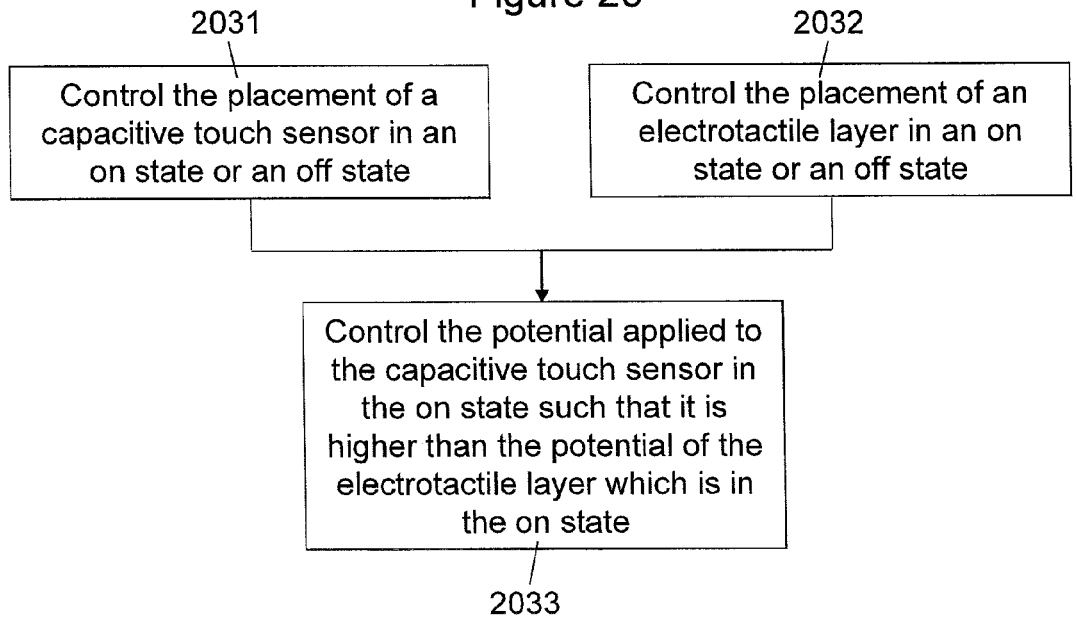

Figure 21
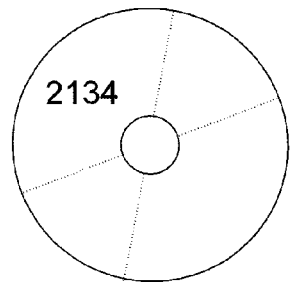
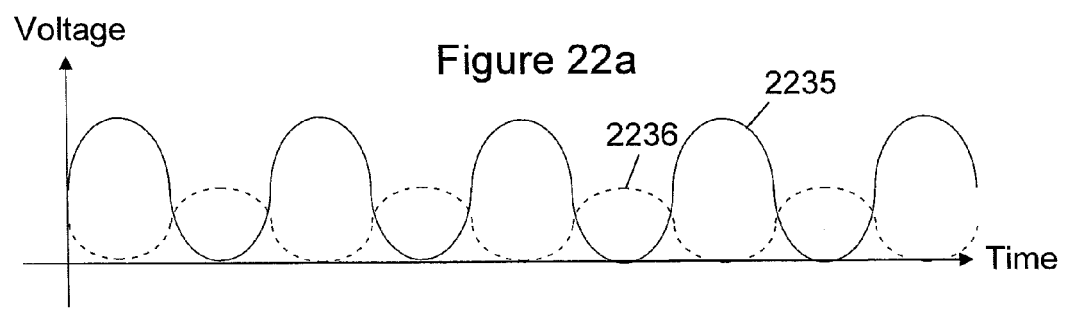
Figure 22a
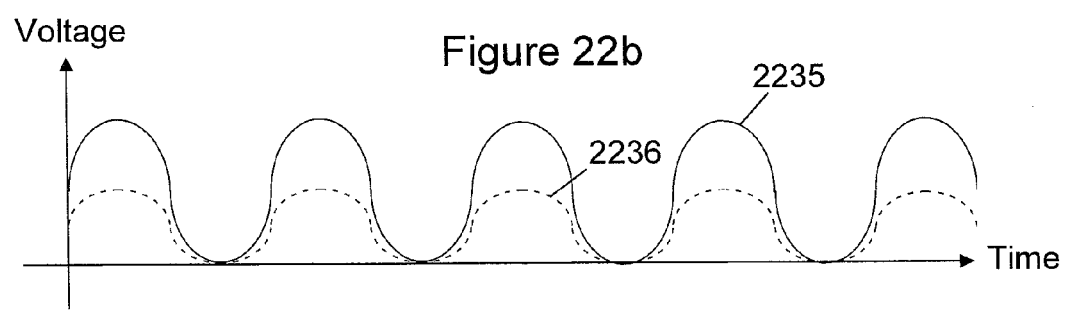
Figure 22b
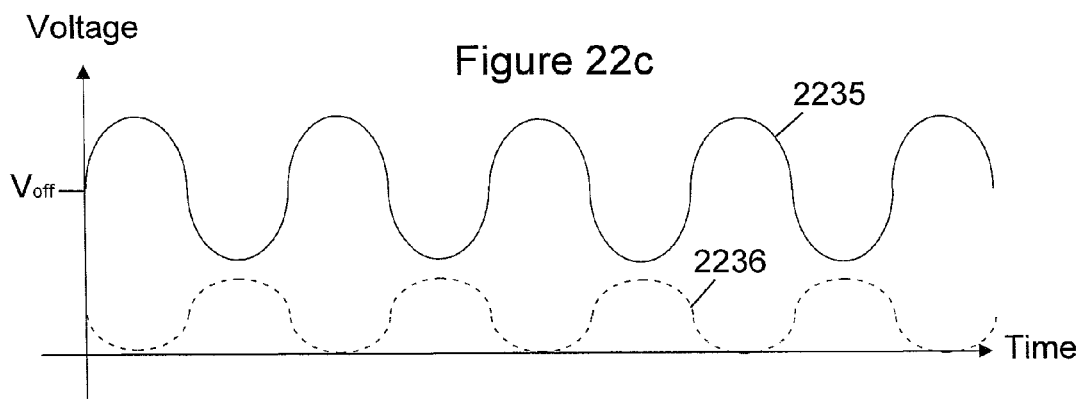
Figure 22c

APPARATUS AND ASSOCIATED METHODS

CROSS-REFERENCE TO RELATED APPLICATION

This patent application is a continuation-in-part of U.S. patent application Ser. No. 13/281,776, filed Oct. 26, 2011 which is hereby incorporated by reference in its entirety.

TECHNICAL FIELD

The present disclosure relates to the field of touchscreen displays associated methods and apparatus, and in particular concerns an electrotactile stimulation system which is compatible with capacitive touch technology. Certain disclosed example aspects/embodiments relate to portable electronic devices, in particular, so-called hand-portable electronic devices which may be hand-held in use (although they may be placed in a cradle in use). Such hand-portable electronic devices include so-called Personal Digital Assistants (PDAs).

The portable electronic devices/apparatus according to one or more disclosed example aspects/embodiments may provide one or more audio/text/video communication functions (e.g. tele-communication, video-communication, and/or text transmission, Short Message Service (SMS)/Multimedia Message Service (MMS)/emailing functions, interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

BACKGROUND

In touch user interfaces, a capacitive sensing matrix for touch detection is gaining greater adherence than traditional resistive touchscreen solutions. Neither technology, however, incorporates haptic feedback. There are several emerging technologies aiming to introduce haptic feedback without mechanically moving parts. One of these is an electrotactile surface which takes advantage of capacitive coupling to the user's skin to create a variable frictional force on the touchscreen panel. However, combining capacitive sensing and haptic feedback in the same electronic display is a technical challenge.

The apparatus and methods disclosed herein may or may not address this issue.

The listing or discussion of a prior-published document or any background in this specification should not necessarily be taken as an acknowledgement that the document or background is part of the state of the art or is common general knowledge. One or more aspects/embodiments of the present disclosure may or may not address one or more of the background issues.

SUMMARY

According to a first aspect, there is provided an apparatus comprising at least one processor and at least one memory including computer program code, the at least one memory and the computer program code configured to, with the at least one processor, cause the apparatus at least to, for an array of capacitive touch sensors with a proximally positioned electrotactile layer, compare the capacitance associated with a capacitive touch sensor of the array against a respective detection threshold to determine whether or not a touch input has occurred at the capacitive touch sensor by a stylus in capacitive coupling proximity to the capacitive touch sensor, wherein the detection threshold of one or more capacitive touch sensors of the array is set to be sufficient to inhibit the erroneous generation of a touch input signal at the one or more respective capacitive touch sensors caused by capacitive cross-coupling, via the electrotactile layer, to the capacitive touch sensor which is in capacitive coupling proximity to the stylus.

In specific embodiments, the term "capacitive touch sensor" may be taken to mean a single node of a capacitive touch sensor array, a plurality of nodes of a capacitive touch sensor array, or even the whole array. In specific embodiments, the term "electrotactile layer" may be taken to mean the conductive electrode of an electrotactile system used to provide haptic feedback. The capacitive touch sensor array may comprise two or more capacitive touch sensors.

The term "stylus" may be taken to mean any object which is capable of holding electrical charge and which can be used to provide a touch input. The stylus may be made from an electrically conductive material or a dielectric material. The stylus may be a user of the apparatus (e.g. a user's finger), a conventional input stylus (e.g. a stylus as used with PDAs and the like), or a glove worn by a user of the apparatus (e.g. a glove comprising fingertips configured to hold electrical charge).

The detection threshold of each capacitive touch sensor of the array may be set to be sufficient to inhibit the erroneous generation of a touch input signal at the respective capacitive touch sensor. The same detection threshold may be set for each capacitive touch sensor of the array. The detection threshold set for one capacitive touch sensor may be different from the detection threshold set for another capacitive touch sensor.

The detection threshold may be determined based on a peak capacitance associated with one or more sensors and filtering out lower capacitances associated with adjacent touch sensors. The detection threshold may be determined using a calibration application configured to provide targets associated with touch input.

The electrotactile layer may comprise one or more apertures configured to reduce the capacitive cross-coupling. At least one of the one or more apertures may have a circular, elliptical, square, diamond or trapezoidal shape.

The dimensions, positioning and/or shape of the one or more apertures may reduce the capacitive cross-coupling. The dimensions, positioning and/or shape of the one or more apertures may be such that the material used to form the electrotactile layer does not completely overlap with any of the capacitive touch sensors. The material used to form the electrotactile layer may partially overlap with one or more of the capacitive touch sensors (e.g. covers up to 10%, 25% or 50% of the area of the respective capacitive touch sensors), or it may not overlap with any of the capacitive touch sensors at all. The dimensions, positioning and/or shape of the one or more apertures may be such that the electrotactile layer is able to couple capacitively to the stylus when the stylus is positioned to provide a touch input to a capacitive touch sensor. The dimensions, positioning and/or shape of the one or more apertures may be such that none of the material used to form the electrotactile layer is located directly above or below the capacitive touch sensors. The dimensions, positioning and/or shape of the one or more apertures may be such that the capacitive cross-coupling is insufficient to prevent detection of a touch input when the stylus is in proximity to a capacitive touch sensor. The dimensions, positioning and/or shape of the one or more apertures may be such that the capacitive cross-coupling causes a negligible variation in the capacitance of the capacitive touch sensors.

The electrotactile layer may comprise a plurality of apertures. Each aperture may be configured to reduce the capacitive cross-coupling between one capacitive touch sensor and the electrotactile layer. Each aperture may be configured to reduce the capacitive cross-coupling between multiple capacitive touch sensors and the electrotactile layer.

The apparatus may comprise the array of capacitive touch sensors and the electrotactile layer. The electrotactile layer may be positioned on top of the capacitive touch sensor array. The electrotactile layer may be located between upper and lower layers of electrically insulating material. The capacitive touch sensor array and the electrotactile layer may be separated by the lower layer of electrically insulating material.

The electrotactile layer may comprise one or more of a metal and a semiconductor. The metal may comprise one or more of gold, silver and copper. The semiconductor may comprise one or more of indium tin oxide and vanadium oxide. The electrotactile layer may be formed as one or more of a thin film and a network of nanowires (e.g. silver, carbon, zinc oxide)/graphene nano-ribbons or graphene nanowires.

The capacitive touch sensors may be self-capacitive touch sensors each comprising a single electrode. The stylus may form a capacitor with the single electrode when the stylus is in proximity to the capacitive touch sensor. Capacitive coupling between the capacitive touch sensor and the stylus may cause a variation (increase or decrease depending on the stylus material) in the capacitance of the single electrode. The variation in capacitance may be between 1 fF and 5 pF.

The capacitive touch sensors may be mutually-capacitive touch sensors each comprising transmitter and receiver electrodes. The mutually-capacitive touch sensors may be horizontally or vertically-arranged mutually-capacitive touch sensors. The transmitter and receiver electrodes may be configured to generate an electric field therebetween. The stylus may interfere with the electric field when the stylus is in proximity to the capacitive touch sensor. Capacitive coupling between the capacitive touch sensor and the stylus may cause a variation (increase or decrease depending on the stylus material) in the capacitance of the receiver electrode. The variation in capacitance may be between 1 fF and 5 pF.

The apparatus may be configured to place each capacitive touch sensor in an on state or an off state by controlling a potential applied to the capacitive touch sensor such that, in the on state, a first potential is applied to the capacitive touch sensor, and in the off state, a second potential is applied to the capacitive touch sensor. The capacitive touch sensor may be configured to enable the detection of a touch input when it is in the on state but not when it is in the off state.

The apparatus may be configured to place the electrotactile layer in an on state or an off state by controlling a potential applied to the electrotactile layer such that, in the on state, a third potential is applied to the electrotactile layer, and in the off state, a fourth potential is applied to the electrotactile layer. The electrotactile layer may be configured to enable the provision of haptic feedback when it is in the on state but not when it is in the off state.

The first potential and third potential may be periodic potentials. The first potential may be higher than the third potential when the capacitive touch sensor and electrotactile layer are in their respective on states at the same time to reduce charge transfer from the electrotactile layer to the capacitive touch sensor caused by the proximity of the electrotactile layer to the capacitive touch sensor. The frequency and phase of the first potential and third potential may be substantially the same. The amplitude of the first potential may be higher than the amplitude of the third potential. The first potential may comprise a DC offset such that the magnitude of the first potential is higher than the magnitude of the third potential.

The first potential may be higher than the second potential. The third potential may be higher than the fourth potential. The first potential and fourth potential may be periodic potentials. The first potential and fourth potential may have substantially the same frequency, amplitude and phase when the capacitive touch sensor is in the on state whilst the electrotactile layer is in the off state. The second potential may be a ground or floating potential.

The term "higher" in relation to electrostatic potential (as used throughout the specification) assumes that a positive potential is higher than a negative potential. Therefore, a potential of +10V is taken to be higher than a potential of −10V. In addition, a potential of −10V is taken to be higher than a potential of −20V.

The third potential may be a periodic potential. The apparatus may be configured to place the electrotactile layer in the on state by controlling one or more of the amplitude, frequency, duration and polarity of the periodic potential. The periodic potential may comprise a plurality of basic pulses. The apparatus may be configured to place the capacitive touch sensors in the on state when the electrotactile layer is in the off state between application of the basic pulses.

The apparatus may be configured to place the electrotactile layer in the on state in response to a touch input being detected by a capacitive touch sensor to provide haptic feedback associated with the touch input.

The apparatus may be configured to monitor the capacitance associated with the capacitive touch sensor array to detect a touch input.

The apparatus may be configured to place the capacitive touch sensors and the electrotactile layer in their respective states using one or more switches. The one or more switches may be configured to connect the electrotactile layer to an active shield of the capacitive touch sensor array when the electrotactile layer is in the off state.

The one or more switches may be configured to connect the capacitive touch sensors to a sensor module and the electrotactile layer to an electrotactile module when the capacitive touch sensors and electrotactile layer are in their respective on states. The sensor module may comprise one or more of a sensor power supply, a sensor control circuit and a sensor measurement circuit. The electrotactile module may comprise one or more of an electrotactile power supply, an electrotactile control circuit and a stylus ground.

The apparatus may be one or more of an electronic device, a portable electronic device, a portable telecommunications device, a touchscreen display for any of the aforementioned devices, and a module for any of the aforementioned devices.

According to a further aspect, there is provided an apparatus comprising:
  means for comparing the capacitance associated with a capacitive touch sensor of the array against a respective detection threshold to determine whether or not a touch input has occurred at the capacitive touch sensor by a stylus in capacitive coupling proximity to the capacitive touch sensor, wherein the detection threshold of one or more capacitive touch sensors of the array is set to be sufficient to inhibit the erroneous generation of a touch input signal at the one or more respective capacitive touch sensors caused by capacitive cross-coupling, via the electrotactile layer, to the capacitive touch sensor which is in capacitive coupling proximity to the stylus.

According to a further aspect, there is provided a method comprising:

comparing the capacitance associated with a capacitive touch sensor of the array against a respective detection threshold to determine whether or not a touch input has occurred at the capacitive touch sensor by a stylus in capacitive coupling proximity to the capacitive touch sensor, wherein the detection threshold of one or more capacitive touch sensors of the array is set to be sufficient to inhibit the erroneous generation of a touch input signal at the one or more respective capacitive touch sensors caused by capacitive cross-coupling, via the electrotactile layer, to the capacitive touch sensor which is in capacitive coupling proximity to the stylus.

According to a further aspect, there is provided an apparatus comprising:

a first sensor configured to couple capacitively to a stylus when said stylus is in proximity to the first sensor, capacitive coupling between the first sensor and the stylus configured to generate a first touch input signal to enable detection of a first touch input; and a layer configured to couple capacitively to the stylus when said stylus is in proximity to the layer, capacitive coupling between the layer and the stylus configured to provide haptic feedback, wherein the layer is positioned adjacent the first sensor, the positioning resulting in capacitive cross-coupling between the first sensor and the layer, and wherein the layer comprises one or more apertures configured to reduce the capacitive cross-coupling.

The dimensions, positioning and/or shape of the one or more apertures may be chosen to reduce the capacitive cross-coupling. The dimensions, positioning and/or shape of the one or more apertures may be chosen such that the material used to form the layer does not completely overlap with (i.e. located directly above or below) the first sensor. The material used to form the layer may partially overlap with the first sensor (e.g. covers up to 10%, 25% or 50% of the area of the sensor), or it may not overlap with the first sensor at all. The dimensions, positioning and/or shape of the one or more apertures may be chosen such that the capacitive cross-coupling is insufficient to prevent detection of the first touch input when the stylus is in proximity to the first sensor. The dimensions, positioning and/or shape of the one or more apertures may be chosen such that the layer is able to couple capacitively to the stylus when said stylus is positioned to provide a touch input to the first sensor.

The apparatus may comprise a second sensor. The second sensor may be configured to couple capacitively to the stylus when said stylus is in proximity to the second sensor. Capacitive coupling between the second sensor and the stylus may be configured to generate a second touch input signal to enable detection of a second touch input. The layer may be positioned adjacent the second sensor. The positioning may result in capacitive cross-coupling between the second sensor and the layer. The one or more apertures may be configured to reduce the capacitive cross-coupling between the second sensor and the layer.

The dimensions, positioning and/or shape of the one or more apertures may be chosen such that the capacitive cross-coupling between the first and second sensors and the layer is insufficient to cause the unintentional generation of a second touch input signal when the stylus couples capacitively to the first sensor.

Capacitive coupling between the first sensor and the stylus may vary the capacitance of the first sensor. The dimensions, positioning and/or shape of the one or more apertures may be chosen such that the capacitive cross-coupling causes a negligible variation in the capacitance of the first sensor.

The first sensor may comprise an electrode. The stylus may form a capacitor with the electrode when the stylus is in proximity to the first sensor. Capacitive coupling between the first sensor and the stylus may cause a variation (increase or decrease depending on the stylus material) in the capacitance of the electrode. The variation in capacitance may be between 1 fF and 5 pF.

The first sensor may comprise transmitter and receiver electrodes configured to generate an electric field therebetween. The stylus may interfere with the electric field when the stylus is in proximity to the first sensor. Capacitive coupling between the first sensor and the stylus may cause a variation (increase or decrease depending on the stylus material) in the capacitance of the receiver electrode. The variation in capacitance may be between 1 fF and 5 pF.

The first sensor may be a capacitive touch sensor. The first sensor may be a self-capacitive touch sensor. The first sensor may be a mutually-capacitive touch sensor. The mutually-capacitive touch sensor may be a horizontally or vertically-arranged mutually-capacitive touch sensor.

The layer may comprise one or more of a metal and a semiconductor. The metal may comprise one or more of gold, silver and copper. The semiconductor may comprise one or more of indium tin oxide and vanadium oxide. The layer may be formed as one or more of a thin film and a network of nanowires (e.g. silver, carbon, zinc oxide)/graphene nano-ribbons or graphene nanowires. At least one of the one or more apertures may have a circular, elliptical, square, diamond or trapezoidal shape.

The layer may be an electrotactile layer. The electrotactile layer may be positioned on top of the first sensor. The electrotactile layer may be located between upper and lower layers of electrically insulating material. The first sensor and the electrotactile layer may be separated by the lower layer of electrically insulating material.

The apparatus may comprise a plurality of sensors. Each sensor may be configured to couple capacitively to the stylus when said stylus is in proximity to the sensor. Capacitive coupling between each sensor and the stylus may be configured to generate a respective touch input signal to enable detection of a respective touch input. The layer may be positioned adjacent the plurality of sensors. The positioning may result in capacitive cross-coupling between each sensor and the layer. The one or more apertures may be configured to reduce the capacitive cross-coupling between each sensor and the layer.

The layer may comprise a plurality of apertures. Each aperture may be configured to reduce the capacitive cross-coupling between one sensor and the layer. Each aperture may be configured to reduce the capacitive cross-coupling between multiple sensors and the layer.

The apparatus may be one or more of an electronic device, a portable electronic device, a portable telecommunications device, a touchscreen display for any of the aforementioned devices, and a module for any of the aforementioned devices.

According to a further aspect, there is provided an apparatus comprising:
means for detecting a touch input, the means for detecting a touch input configured to couple capacitively to a stylus when said stylus is in proximity to the means for detecting a touch input, capacitive coupling between the means for detecting a touch input and the stylus configured to generate a first touch input signal to enable detection of a first touch input,
means for providing haptic feedback configured to couple capacitively to the stylus when said stylus is in proximity to the means for providing haptic feedback, capacitive coupling between the means for providing haptic feedback and the stylus configured to provide haptic feedback,
wherein the means for providing haptic feedback is positioned adjacent the means for detecting a touch input, the positioning resulting in capacitive cross-coupling between the means for detecting a touch input and the means for providing haptic feedback, and
wherein the means for providing haptic feedback comprises one or more apertures configured to reduce the capacitive cross-coupling.

According to a further aspect, there is provided a layer for a device,
the device comprising a first sensor configured to couple capacitively to a stylus when said stylus is in proximity to the first sensor, capacitive coupling between the first sensor and the stylus configured to generate a first touch input signal to enable detection of a first touch input,
the layer configured to couple capacitively to the stylus when said stylus is in proximity to the layer, capacitive coupling between the layer and the stylus configured to provide haptic feedback,
wherein the layer, when fitted to the device, is positioned adjacent the first sensor, the positioning resulting in capacitive cross-coupling between the first sensor and the layer, and
wherein the layer comprises one or more apertures configured to reduce the capacitive cross-coupling.

According to a further aspect, there is provided a method comprising:
providing a first sensor configured to couple capacitively to a stylus when said stylus is in proximity to the first sensor, capacitive coupling between the first sensor and the stylus configured to generate a first touch input signal to enable detection of a first touch input;
providing a layer configured to couple capacitively to the stylus when said stylus is in proximity to the layer, capacitive coupling between the layer and the stylus configured to provide haptic feedback, wherein the layer is positioned adjacent the first sensor; the positioning resulting in capacitive cross-coupling between the first sensor and the layer; and
providing one or more apertures in the layer, the one or more apertures configured to reduce the capacitive cross-coupling.

According to a further aspect, there is provided a method comprising:
providing a layer for a device, the device comprising a first sensor configured to couple capacitively to a stylus when said stylus is in proximity to the first sensor, capacitive coupling between the first sensor and the stylus configured to generate a first touch input signal to enable detection of a first touch input, the layer configured to couple capacitively to the stylus when said stylus is in proximity to the layer, capacitive coupling between the layer and the stylus configured to provide haptic feedback, wherein the layer, when fitted to the device, is positioned adjacent the first sensor, the positioning resulting in capacitive cross-coupling between the first sensor and the layer; and
forming one or more apertures in the layer, the one or more apertures configured to reduce the capacitive cross-coupling.

According to a further aspect, there is provided a method comprising:
detecting a first touch input using an apparatus, the apparatus comprising a first sensor configured to couple capacitively to a stylus when said stylus is in proximity to the first sensor, capacitive coupling between the first sensor and the stylus configured to generate a first touch input signal to enable detection of a first touch input, and a layer configured to couple capacitively to the stylus when said stylus is in proximity to the layer, capacitive coupling between the layer and the stylus configured to provide haptic feedback, wherein the layer is positioned adjacent the first sensor, the positioning resulting in capacitive cross-coupling between the first sensor and the layer, and wherein the layer comprises one or more apertures configured to reduce the capacitive cross-coupling.

According to a further aspect, there is provided an apparatus comprising:
a capacitive touch sensor configured to detect a touch input from a stylus when said stylus is in proximity to the capacitive touch sensor; and
an electrotactile layer configured to provide haptic feedback to a stylus when said stylus is in proximity to the electrotactile layer,
wherein the capacitive touch sensor is configured to detect a touch input when the sensor is in an on state but not in an off state, and the electrotactile layer is configured to provide haptic feedback when the electrotactile layer is in an on state but not in an off state, and
wherein the apparatus is configured to place the capacitive touch sensor or electrotactile layer in the on state to provide for the respective touch input detection or haptic feedback only when the other of the electrotactile layer or capacitive touch sensor is in the off state.

The apparatus may be configured to alternate the states of the capacitive touch sensor and electrotactile layer periodically. The apparatus may be configured to control the states of the capacitive touch sensor and electrotactile layer using a plurality of switches.

This aspect may be used in conjunction with the aforementioned aperture aspects.

The capacitive touch sensor may be configured to couple capacitively to the stylus when said stylus is in proximity to the sensor. Capacitive coupling between the sensor and the stylus may be configured to generate a touch input signal to enable detection of the touch input. The electrotactile layer may be configured to couple capacitively to the stylus when said stylus is in proximity to the electrotactile layer. Capacitive coupling between the electrotactile layer and the stylus may be configured to provide the haptic feedback. The electrotactile layer may be positioned adjacent the capacitive touch sensor. The positioning may result in capacitive cross-coupling between the sensor and the electrotactile layer. The electrotactile layer may comprise one or more apertures configured to reduce the capacitive cross-coupling.

According to a further aspect, there is provided a method comprising:

providing for control/use of a capacitive touch sensor of an apparatus to be in the on state and an electrotactile layer of an apparatus to be in the off state to enable detection of a touch input using the capacitive touch sensor, the apparatus comprising the capacitive touch sensor and the electrotactile layer, the capacitive touch sensor configured to detect a touch input from a stylus when said stylus is in proximity to the capacitive touch sensor, the electrotactile layer configured to provide haptic feedback to a stylus when said stylus is in proximity to the electrotactile layer, wherein the capacitive touch sensor is configured to detect a touch input when the sensor is in an on state but not in an off state, and the electrotactile layer is configured to provide haptic feedback when the electrotactile layer is in an on state but not in an off state, and wherein the apparatus is configured to place the capacitive touch sensor or electrotactile layer in the on state to provide for the respective touch input detection or haptic feedback only when the other of the electrotactile layer or capacitive touch sensor is in the off state.

The method may comprise providing haptic feedback to a user of the apparatus in response to the detected first touch input.

The steps of any method disclosed herein do not have to be performed in the exact order disclosed, unless explicitly stated or understood by the skilled person.

According to a further aspect, there is provided a computer program (which may or may not be recorded on a carrier), the computer program comprising computer code configured to perform any method described herein.

The apparatus may comprise a processor configured to process the code of the computer program. The processor may be a microprocessor, including an Application Specific Integrated Circuit (ASIC).

The present disclosure includes one or more corresponding aspects, example embodiments or features in isolation or in various combinations whether or not specifically stated (including claimed) in that combination or in isolation. Corresponding means and corresponding functional units (e.g. controllers for the electrotactile layer and capacitive touch sensors) for performing one or more of the discussed functions are also within the present disclosure.

According to a further aspect, there is provided an apparatus comprising at least one processor and at least one memory including computer program code, the at least one memory and the computer program code configured to, with the at least one processor, cause the apparatus at least to:

place a capacitive touch sensor in an on state or an off state by controlling a potential applied to the capacitive touch sensor such that, in the on state, a first potential is applied to the capacitive touch sensor, and in the off state, a second potential is applied to the capacitive touch sensor, the capacitive touch sensor configured to enable the detection of a touch input when it is in the on state but not when it is in the off state; and place an electrotactile layer, proximal to the touch sensor, in an on state or an off state by controlling a potential applied to the electrotactile layer such that, in the on state, a third potential is applied to the electrotactile layer, and in the off state, a fourth potential is applied to the electrotactile layer, the electrotactile layer configured to enable the provision of haptic feedback when it is in the on state but not when it is in the off state, wherein the first potential and fourth potential are periodic potentials, and wherein the first potential and fourth potential have substantially the same frequency, amplitude and phase when the capacitive touch sensor is in the on state whilst the electrotactile layer is in the off state to reduce capacitive cross-coupling caused by the proximity of the electrotactile layer to the capacitive touch sensor.

In specific embodiments, the term "capacitive touch sensor" may be taken to mean a single node of a capacitive touch sensor array, a plurality of nodes of a capacitive touch sensor array, or even the whole array. In specific embodiments, the term "electrotactile layer" may be taken to mean the conductive electrode of an electrotactile system used to provide haptic feedback.

The first potential may be higher than the second potential. The third potential may be higher than the fourth potential. The first potential and third potential may be periodic potentials. The first potential may be higher than the third potential when the capacitive touch sensor and electrotactile layer are in their respective on states at the same time. The frequency and phase of the first potential and third potential may be substantially the same. The amplitude of the first potential may be higher than the amplitude of the third potential. The first potential may comprise a DC offset such that the magnitude of the first potential is higher than the magnitude of the third potential. The second potential may be a ground or floating potential.

The term "higher" in relation to electrostatic potential (as used throughout the specification) assumes that a positive potential is higher than a negative potential. Therefore, a potential of +10V is taken to be higher than a potential of −10V. In addition, a potential of −10V is taken to be higher than a potential of −20V.

The third potential may be a periodic potential. The apparatus may be configured to place the electrotactile layer in the on state by controlling one or more of the amplitude, frequency, duration and polarity of the periodic potential. The periodic potential may comprise a plurality of basic pulses. The apparatus may be configured to place the capacitive touch sensor in the on state when the electrotactile layer is in the off state. The apparatus may be configured to place the capacitive touch sensor in the on state when the electrotactile layer is in the off state between application of the basic pulses.

The apparatus may be configured to place the electrotactile layer in the on state in response to a touch input being detected by the capacitive touch sensor to provide haptic feedback associated with the touch input.

The apparatus may be configured to monitor the capacitance associated with the capacitive touch sensor to detect a touch input.

The apparatus may be configured to place the capacitive touch sensor and the electrotactile layer in their respective states using one or more switches. The one or more switches may be configured to connect the electrotactile layer to an active shield of the capacitive touch sensor when the electrotactile layer is in the off state.

The one or more switches may be configured to connect the capacitive touch sensor to a sensor module and the electrotactile layer to an electrotactile module when the capacitive touch sensor and electrotactile layer are in their respective on states. The sensor module may comprise one or more of a sensor power supply, a sensor control circuit and a sensor measurement circuit. The electrotactile module may comprise one or more of an electrotactile power supply, an electrotactile control circuit and a stylus ground.

The apparatus may comprise the capacitive touch sensor and the electrotactile layer. The electrotactile layer may be positioned on top of the capacitive touch sensor. The electrotactile layer may be located between upper and lower layers of electrically insulating material. The capacitive touch sensor and the electrotactile layer may be separated by the lower layer of electrically insulating material.

The electrotactile layer may comprise one or more of a metal and a semiconductor. The metal may comprise one or more of gold, silver and copper. The semiconductor may comprise one or more of indium tin oxide and vanadium oxide. The electrotactile layer may be formed as one or more of a thin film and a network of nanowires (e.g. silver, carbon, zinc oxide)/graphene nano-ribbons or graphene nanowires.

The capacitive touch sensor may be configured to, when in the on state, couple capacitively to a stylus when the stylus is in proximity to the capacitive touch sensor. Capacitive coupling between the capacitive touch sensor and the stylus may be configured to generate a touch input signal to enable detection of a touch input.

The electrotactile layer may be configured to, when in the on state, couple capacitively to the stylus when the stylus is in proximity to the electrotactile layer. Capacitive coupling between the electrotactile layer and the stylus may be configured to provide haptic feedback.

The term "stylus" may be taken to mean any object which is capable of holding electrical charge and which can be used to provide a touch input. The stylus may be made from an electrically conductive material or a dielectric material. The stylus may be a user of the apparatus (e.g. a user's finger), a conventional input stylus (e.g. a stylus as used with PDAs and the like), or a glove worn by a user of the apparatus (e.g. a glove comprising fingertips configured to hold electrical charge).

The electrotactile layer may comprise one or more apertures configured to reduce the capacitive cross-coupling. At least one of the one or more apertures may have a circular, elliptical, square, diamond or trapezoidal shape. The dimensions, positioning and/or shape of the one or more apertures may reduce the capacitive cross-coupling. The dimensions, positioning and/or shape of the one or more apertures may be such that the material used to form the electrotactile layer does not completely overlap with (i.e. located directly above or below) the capacitive touch sensor. The material used to form the electrotactile layer may partially overlap with the capacitive touch sensor (e.g. covers up to 10%, 25% or 50% of the area of the capacitive touch sensor), or it may not overlap with the capacitive touch sensor at all. The dimensions, positioning and/or shape of the one or more apertures may be such that the electrotactile layer is able to couple capacitively to the stylus when the stylus is positioned to provide a touch input to the capacitive touch sensor. The dimensions, positioning and/or shape of the one or more apertures may be such that none of the material used to form the electrotactile layer is located directly above or below the capacitive touch sensor. The dimensions, positioning and/or shape of the one or more apertures may be such that the capacitive cross-coupling is insufficient to prevent detection of the touch input when the stylus is in proximity to the capacitive touch sensor. The dimensions, positioning and/or shape of the one or more apertures may be such that the capacitive cross-coupling causes a negligible variation in the capacitance of the capacitive touch sensor.

The capacitive touch sensor may be a self-capacitive touch sensor comprising a single electrode. The apparatus may be configured to place the self-capacitive touch sensor in the on state or the off state by controlling the potential applied to the single electrode. The stylus may form a capacitor with the single electrode when the stylus is in proximity to the capacitive touch sensor. Capacitive coupling between the capacitive touch sensor and the stylus may cause a variation (increase or decrease depending on the stylus material) in the capacitance of the single electrode. The variation in capacitance may be between 1 fF and 5 pF.

The capacitive touch sensor may be a mutually-capacitive touch sensor comprising transmitter and receiver electrodes. The mutually-capacitive touch sensor may be a horizontally or vertically-arranged mutually-capacitive touch sensor. The apparatus may be configured to place the mutually-capacitive touch sensor in the on state or the off state by controlling the potential applied to the transmitter electrode. The transmitter and receiver electrodes may be configured to generate an electric field therebetween. The stylus may interfere with the electric field when the stylus is in proximity to the capacitive touch sensor. Capacitive coupling between the capacitive touch sensor and the stylus may cause a variation (increase or decrease depending on the stylus material) in the capacitance of the receiver electrode. The variation in capacitance may be between 1 fF and 5 pF.

The apparatus may be one or more of an electronic device, a portable electronic device, a portable telecommunications device, a touchscreen display for any of the aforementioned devices, and a module for any of the aforementioned devices.

According to a further aspect, there is provided an apparatus comprising:
  means for placing a capacitive touch sensor in an on state or an off state by controlling a potential applied to the capacitive touch sensor such that, in the on state, a first potential is applied to the capacitive touch sensor, and in the off state, a second potential is applied to the capacitive touch sensor, the capacitive touch sensor configured to enable the detection of a touch input when it is in the on state but not when it is in the off state; and
  means for placing an electrotactile layer, proximal to the touch sensor, in an on state or an off state by controlling a potential applied to the electrotactile layer such that, in the on state, a third potential is applied to the electrotactile layer, and in the off state, a fourth potential is applied to the electrotactile layer, the electrotactile layer configured to enable the provision of haptic feedback when it is in the on state but not when it is in the off state,
  wherein the first potential and fourth potential are periodic potentials, and wherein the first potential and fourth potential have substantially the same frequency, amplitude and phase when the capacitive touch sensor is in the on state whilst the electrotactile layer is in the off state to reduce capacitive cross-coupling caused by the proximity of the electrotactile layer to the capacitive touch sensor.

According to a further aspect, there is provided a method comprising:
  placing a capacitive touch sensor in an on state or an off state by controlling a potential applied to the capacitive touch sensor such that, in the on state, a first potential is applied to the capacitive touch sensor, and in the off state, a second potential is applied to the capacitive touch sensor, the capacitive touch sensor configured to enable the detection of a touch input when it is in the on state but not when it is in the off state; and placing an electrotactile layer, proximal to the touch sensor, in an on state or an off state by controlling a potential applied to the electrotactile layer such that, in the on state, a third potential is applied to the electrotactile layer, and in the off state, a fourth potential is applied to the electrotactile layer, the electrotactile layer configured to enable the provision of haptic feedback when it is in the on state but not when it is in the off state, wherein the first potential and fourth potential are periodic potentials, and wherein the first potential and fourth potential have substantially the same frequency, amplitude and phase when the capacitive touch sensor is in the on state whilst the electrotactile layer is in the off state to reduce capacitive cross-coupling caused by the proximity of the electrotactile layer to the capacitive touch sensor.

According to a first aspect, there is provided an apparatus comprising at least one processor and at least one memory including computer program code, the at least one memory and the computer program code configured to, with the at least one processor, cause the apparatus at least to:

place a capacitive touch sensor in an on state or an off state by controlling a potential applied to the capacitive touch sensor such that, in the on state, a first potential is applied to the capacitive touch sensor, and in the off state, a second potential is applied to the capacitive touch sensor, the capacitive touch sensor configured to enable the detection of a touch input when it is in the on state but not when it is in the off state; and place an electrotactile layer, proximal to the capacitive touch sensor, in an on state or an off state by controlling a potential applied to the electrotactile layer such that, in the on state, a third potential is applied to the electrotactile layer, and in the off state, a fourth potential is applied to the electrotactile layer, the electrotactile layer configured to enable the provision of haptic feedback when it is in the on state but not when it is in the off state, wherein the first potential and third potential are periodic potentials, and wherein the first potential is higher than the third potential when the capacitive touch sensor and electrotactile layer are in their respective on states at the same time to reduce charge transfer from the electrotactile layer to the capacitive touch sensor caused by the proximity of the electrotactile layer to the capacitive touch sensor.

In specific embodiments, the term "capacitive touch sensor" may be taken to mean a single node of a capacitive touch sensor array, a plurality of nodes of a capacitive touch sensor array, or even the whole array. In specific embodiments, the term "electrotactile layer" may be taken to mean the conductive electrode of an electrotactile system used to provide haptic feedback.

The frequency and phase of the first potential and third potential may be substantially the same. The amplitude of the first potential may be higher than the amplitude of the third potential. The first potential may comprise a DC offset such that the magnitude of the first potential is higher than the magnitude of the third potential.

The first potential may be higher than the second potential. The third potential may be higher than the fourth potential. The first potential and fourth potential may be periodic potentials. The first potential and fourth potential may have substantially the same frequency, amplitude and phase when the capacitive touch sensor is in the on state whilst the electrotactile layer is in the off state. The second potential may be a ground or floating potential.

The term "higher" in relation to electrostatic potential (as used throughout the specification) assumes that a positive potential is higher than a negative potential. Therefore, a potential of +10V is taken to be higher than a potential of −10V. In addition, a potential of −10V is taken to be higher than a potential of −20V.

The third potential may be a periodic potential. The apparatus may be configured to place the electrotactile layer in the on state by controlling one or more of the amplitude, frequency, duration and polarity of the periodic potential.

The apparatus may be configured to place the electrotactile layer in the on state in response to a touch input being detected by the capacitive touch sensor to provide haptic feedback associated with the touch input.

The apparatus may be configured to monitor the capacitance associated with the capacitive touch sensor to detect a touch input.

The apparatus may be configured to place the capacitive touch sensor and the electrotactile layer in their respective states using one or more switches. The one or more switches may be configured to connect the electrotactile layer to an active shield of the capacitive touch sensor when the electrotactile layer is in the off state.

The one or more switches may be configured to connect the capacitive touch sensor to a sensor module and the electrotactile layer to an electrotactile module when the capacitive touch sensor and electrotactile layer are in their respective on states. The sensor module may comprise one or more of a sensor power supply, a sensor control circuit and a sensor measurement circuit. The electrotactile module may comprise one or more of an electrotactile power supply, an electrotactile control circuit and a stylus ground.

The apparatus may comprise the capacitive touch sensor and the electrotactile layer. The electrotactile layer may be positioned on top of the capacitive touch sensor. The electrotactile layer may be located between upper and lower layers of electrically insulating material. The capacitive touch sensor and the electrotactile layer may be separated by the lower layer of electrically insulating material.

The electrotactile layer may comprise one or more of a metal and a semiconductor. The metal may comprise one or more of gold, silver and copper. The semiconductor may comprise one or more of indium tin oxide and vanadium oxide. The electrotactile layer may be formed as one or more of a thin film and a network of nanowires (e.g. silver, carbon, zinc oxide)/graphene nano-ribbons or graphene nanowires.

The capacitive touch sensor may be configured to, when in the on state, couple capacitively to a stylus when the stylus is in proximity to the capacitive touch sensor.

Capacitive coupling between the capacitive touch sensor and the stylus may be configured to generate a touch input signal to enable detection of a touch input.

The electrotactile layer may be configured to, when in the on state, couple capacitively to the stylus when the stylus is in proximity to the electrotactile layer. Capacitive coupling between the electrotactile layer and the stylus may be configured to provide haptic feedback.

The term "stylus" may be taken to mean any object which is capable of holding electrical charge and which can be used to provide a touch input. The stylus may be made from an electrically conductive material or a dielectric material. The stylus may be a user of the apparatus (e.g. a user's finger), a conventional input stylus (e.g. a stylus as used with PDAs and the like), or a glove worn by a user of the apparatus (e.g. a glove comprising fingertips configured to hold electrical charge).

The proximity of the electrotactile layer to the capacitive touch sensor may result in capacitive cross-coupling between the capacitive touch sensor and the electrotactile layer.

The electrotactile layer may comprise one or more apertures configured to reduce the capacitive cross-coupling. At least one of the one or more apertures may have a circular, elliptical, square, diamond or trapezoidal shape. The dimensions, positioning and/or shape of the one or more apertures may reduce the capacitive cross-coupling. The dimensions, positioning and/or shape of the one or more apertures may be such that the material used to form the electrotactile layer does not completely overlap with (i.e. located directly above or below) the capacitive touch sensor. The material used to form the electrotactile layer may partially overlap with the capacitive touch sensor (e.g. covers up to 10%, 25% or 50% of the area of the capacitive touch sensor), or it may not overlap with the capacitive touch sensor at all. The dimensions, positioning and/or shape of the one or more apertures may be such that the electrotactile layer is able to couple capacitively to the stylus when the stylus is positioned to provide a touch input to the capacitive touch sensor. The dimensions, positioning and/or shape of the one or more apertures may be such that none of the material used to form the electrotactile layer is located directly above or below the capacitive touch sensor. The dimensions, positioning and/or shape of the one or more apertures may be such that the capacitive cross-coupling is insufficient to prevent detection of the touch input when the stylus is in proximity to the capacitive touch sensor. The dimensions, positioning and/or shape of the one or more apertures may be such that the capacitive cross-coupling causes a negligible variation in the capacitance of the capacitive touch sensor.

The capacitive touch sensor may be a self-capacitive touch sensor comprising a single electrode. The apparatus may be configured to place the self-capacitive touch sensor in the on state or the off state by controlling the potential applied to the single electrode. The stylus may form a capacitor with the single electrode when the stylus is in proximity to the capacitive touch sensor. Capacitive coupling between the capacitive touch sensor and the stylus may cause a variation (increase or decrease depending on the stylus material) in the capacitance of the single electrode. The variation in capacitance may be between 1 fF and 5 pF.

The capacitive touch sensor may be a mutually-capacitive touch sensor comprising transmitter and receiver electrodes. The mutually-capacitive touch sensor may be a horizontally or vertically-arranged mutually-capacitive touch sensor. The apparatus may be configured to place the mutually-capacitive touch sensor in the on state or the off state by controlling the potential applied to the transmitter electrode. The transmitter and receiver electrodes may be configured to generate an electric field therebetween. The stylus may interfere with the electric field when the stylus is in proximity to the capacitive touch sensor. Capacitive coupling between the capacitive touch sensor and the stylus may cause a variation (increase or decrease depending on the stylus material) in the capacitance of the receiver electrode. The variation in capacitance may be between 1 fF and 5 pF.

The apparatus may be one or more of an electronic device, a portable electronic device, a portable telecommunications device, a touchscreen display for any of the aforementioned devices, and a module for any of the aforementioned devices.

According to a further aspect, there is provided an apparatus comprising:

means for placing a capacitive touch sensor in an on state or an off state by controlling a potential applied to the capacitive touch sensor such that, in the on state, a first potential is applied to the capacitive touch sensor, and in the off state, a second potential is applied to the capacitive touch sensor, the capacitive touch sensor configured to enable the detection of a touch input when it is in the on state but not when it is in the off state; and means for placing an electrotactile layer, proximal to the capacitive touch sensor, in an on state or an off state by controlling a potential applied to the electrotactile layer such that, in the on state, a third potential is applied to the electrotactile layer, and in the off state, a fourth potential is applied to the electrotactile layer, the electrotactile layer configured to enable the provision of haptic feedback when it is in the on state but not when it is in the off state, wherein the first potential and third potential are periodic potentials, and wherein the first potential is higher than the third potential when the capacitive touch sensor and electrotactile layer are in their respective on states at the same time to reduce charge transfer from the electrotactile layer to the capacitive touch sensor caused by the proximity of the electrotactile layer to the capacitive touch sensor.

The frequency and phase of the first potential and third potential may be substantially the same. The amplitude of the first potential may be higher than the amplitude of the third potential. The first potential may comprise a DC offset such that the magnitude of the first potential is higher than the magnitude of the third potential.

According to a further aspect, there is provided a method comprising:

placing a capacitive touch sensor in an on state or an off state by controlling a potential applied to the capacitive touch sensor such that, in the on state, a first potential is applied to the capacitive touch sensor, and in the off state, a second potential is applied to the capacitive touch sensor, the capacitive touch sensor configured to enable the detection of a touch input when it is in the on state but not when it is in the off state; and placing an electrotactile layer, proximal to the capacitive touch sensor, in an on state or an off state by controlling a potential applied to the electrotactile layer such that, in the on state, a third potential is applied to the electrotactile layer, and in the off state, a fourth potential is applied to the electrotactile layer, the electrotactile layer configured to enable the provision of haptic feedback when it is in the on state but not when it is in the off state, wherein the first potential and third potential are periodic potentials, and wherein the first potential is higher than the third potential when the capacitive touch sensor and electrotactile layer are in their respective on states at the same time to reduce charge transfer from the electrotactile layer to the capacitive touch sensor caused by the proximity of the electrotactile layer to the capacitive touch sensor.

The above summary is intended to be merely exemplary and non-limiting.

BRIEF DESCRIPTION OF THE FIGURES

A description is now given, by way of example only, with reference to the accompanying drawings, in which:

FIG. 5c shows how an electrotactile layer can cause accidental triggering of vertically-arranged mutually-capacitive touch sensors;

FIG. 6a shows an electrotactile layer comprising a plurality of circular apertures;

FIG. 6b shows an electrotactile layer comprising a plurality of square apertures;

FIG. 7a shows how an aperture in an electrotactile layer can facilitate detection of a touch input by a self-capacitive touch sensor;

FIG. 8b shows how apertures in an electrotactile layer can prevent accidental triggering of horizontally-arranged mutually-capacitive touch sensors;

FIG. 8c shows how apertures in an electrotactile layer can prevent accidental triggering of vertically-arranged mutually-capacitive touch sensors;

FIG. 17(a) shows a particular embodiment of an apparatus described herein;

FIG. 17(b) shows a detection threshold setting of an apparatus described herein;

FIG. 17(c) shows a detection threshold setting of an apparatus described herein;

FIG. 17(d) shows a detection threshold setting of an apparatus described herein;

FIG. 17(e) shows a detection threshold setting of an apparatus described herein;

FIG. 18 shows a first method of using an apparatus described herein;

FIG. 19 shows a second method of using an apparatus described herein;

FIG. 20 shows a third method of using an apparatus described herein;

FIG. 21 shows a computer readable medium comprising a computer program for controlling use of an apparatus described herein;

FIG. 22a shows periodic potentials having the same frequency but different amplitudes and phases;

FIG. 22b shows periodic potentials having the same frequency and phase but different amplitudes;

FIG. 22c shows the periodic potentials of FIG. 22a with a DC offset applied to one of the periodic potentials;

DESCRIPTION OF SPECIFIC ASPECTS/EMBODIMENTS

Haptic technology is a tactile feedback technology which takes advantage of a user's sense of touch by applying forces, vibrations, and/or motions upon the user to convey information. In the past, tactile feedback has been used to assist in the creation and control of virtual objects (i.e. objects existing only in a computer simulation), and to enhance control of remote machines and devices.

More recently, however, haptic technology has been used in portable electronic devices to supplement visual content. For example, some devices use haptic technology to produce vibrations in response to touch. This may be combined with touch-sensitive screens, where the vibrations can be used to acknowledge selection of on-screen content by the user. In other devices, vibrations have been used to direct a user to a particular on-screen feature, and even to create a tactile representation of an image to enable perception of displayed content with reduced cognitive effort.

As mentioned in the background section, one method of generating vibrations in the skin is to incorporate an electrotactile system in the display of an electronic device. This technology is based on electrovibration, in which the mechanoreceptors of a user are deceived into perceiving texture when a fingertip is swiped across an insulating layer above an electrical conductor carrying an alternating potential. This effect is due to the varying electrostatic attraction between the conductor and the deeper, liquid-rich conducting layers of the skin—an effect which changes the perceived dynamic function.

Figure 1A:
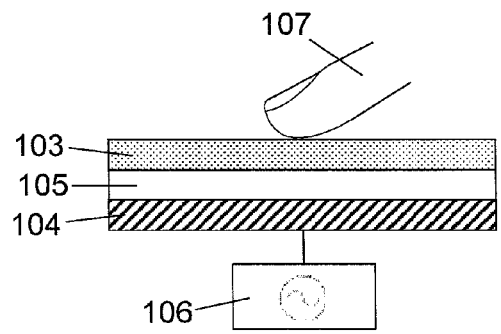
FIG. 1a shows one embodiment of a device/apparatus configured to provide haptic feedback.

FIG. 1a shows a device/apparatus incorporating an electrotactile system. The device comprises an electronic display 103, an electrically conducting layer 104 (referred to herein as the electrotactile layer), an electrically insulating layer 105 and a power supply 106, the electrically insulating layer 105 positioned between a user 107 of the device and the electrotactile layer 104. The power supply 106 is configured to charge the electrotactile layer 104, and the electrically insulating layer 105 is configured to prevent a flow of current between the electrotactile layer 104 and the skin of the user 107 when the user 107 is proximate to the electrotactile layer 104. The electrically insulating layer 105 may be unnecessary, however, if the electronic display 103 is electrically insulating.

The electrotactile layer 104 is configured to allow establishment of an electric field between itself and the user 107. To achieve this, the power supply 106 charges the electrotactile layer 104, and the charge on the electrotactile layer 104 induces charges of opposite polarity on the skin of the user 107. The build up of charge on the electrotactile layer 104 and the user 107 is what forms the electric field. This may be visualised as a (dynamic) capacitor, where the electrotactile layer 104 is the first electrode and the user 107 is the second electrode, the first and second electrodes separated by an electrical insulator 105. The electrostatic force generated by the charge on the electrotactile layer 104 attracts the opposing charge on the user 107 causing movement of the user's skin.

To generate vibration in the skin of the user 107, the power supply 106 varies the magnitude (and/or polarity) of charge on the electrotactile layer 104 periodically. The variation of charge causes variations in electric field strength (and/or direction) which in turn causes vibration in the skin. By controlling the electric field strength, it is possible to tune the frequency and amplitude of the skin vibrations to a specific receptor. Unlike some other types of haptic feedback technology, physical contact between the user 107 and the device is not required because the electrotactile layer 104 couples capacitively to the user's skin, or any other stylus, via the electric field (i.e. action at a distance). In some embodiments, the electrotactile layer may be divided into a plurality of individually controllable segments. This configuration allows one segment to provide a different amplitude and/or frequency of vibration than another segment such that the haptic feedback is different at different regions of the display.

Figure 1B:
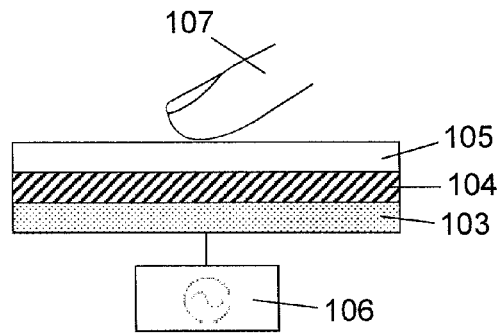
FIG. 1b shows another embodiment of a device/aparatus configured to provide haptic feedback.

In an alternative configuration (shown in FIG. 1b), the electronic display 103 is located below the electrotactile layer 104 and electrically insulating layer 105. This configuration reduces the distance between the electrotactile layer 104 and the user 107, which increases the capacitance. This arrangement therefore allows a smaller potential to be applied to the electrotactile layer 104 to produce the same electrostatic force on the user's skin, which helps to reduce the power consumption of the electrotactile system. The configuration of FIG. 1b, unlike that FIG. 1a, requires the electrotactile layer 104 and electrically insulating layer 105 to be substantially optically transparent, otherwise the user may be unable to see the underlying electronic display 103.

Touchscreen interfaces are electronic visual displays which can detect the presence and location of a touch input within the display area. The term "touchscreen" generally refers to interfaces which interact with a user's finger, but most technologies can also sense other passive objects, such as a stylus. The touchscreen has two main attributes. Firstly, it enables a user to interact directly with what is displayed, rather than indirectly via an onscreen pointer. Secondly, it removes the need for any intermediate input device, such as a mouse or touchpad, which would otherwise be required for controlling the onscreen pointer.

A variety of different touchscreen technologies currently exist. One of these is capacitive touchscreen technology, which encompasses both self-capacitive systems and mutually-capacitive systems.

Figure 2A:
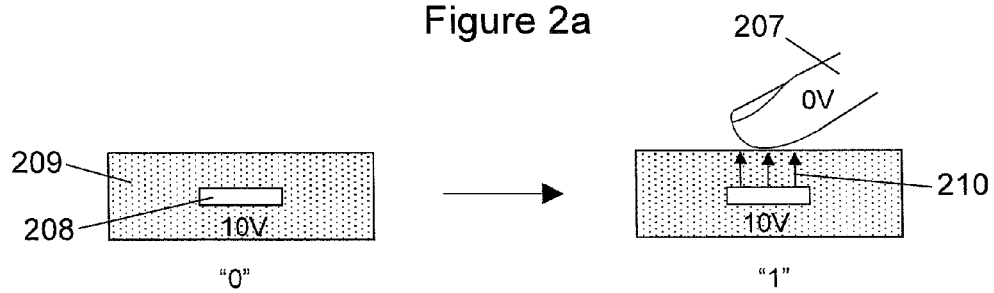
FIG. 2a shows the detection of a touch input by a self-capacitive touch sensor.

A self-capacitive touch sensor (as illustrated in FIG. 2a) comprises an electrical conductor 208 (electrode) separated from the external environment by an electrical insulator 209. Like the electrotactile system, a periodic potential (e.g. with a peak amplitude of 10V in the examples illustrated) is applied to charge the electrode 208. When the user's finger 207 or a stylus (which will usually be grounded) is brought into proximity of the charged electrode 208 (e.g. by touching the electrical insulator 209), opposite charges are induced on the finger/stylus 207 and an electric field 210 is formed therebetween (i.e. the electrode 208 couples capacitively to the user/stylus 207). The electrode 208 and the user/stylus 207 effectively serve as the opposite plates of a (dynamic) capacitor. Therefore, when the user/stylus 207 approaches the sensor, the total capacitance associated with the electrode 208 increases (typically by 1 fF-5 pF).

This change in capacitance is then detected, and if the change exceeds a predetermined threshold value, the sensor interprets this as a touch input. As shown in FIG. 2a, the sensor changes from a "0" state (no touch input) to a "1" state (touch input detected).

Figure 2B:
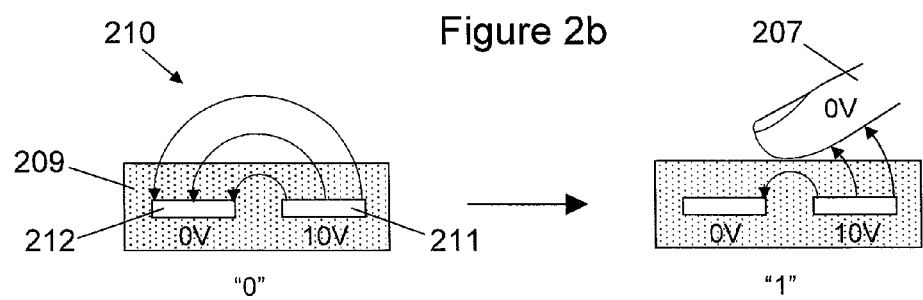
FIG. 2b shows the detection of a touch input by a horizontally-arranged mutually-capacitive touch sensor.

A mutually-capacitive touch sensor (as illustrated in FIG. 2b), however, comprises first 211 and second 212 electrical conductors (transmitter 211 and receiver 212 electrodes). A potential is then applied to charge the transmitter electrode 211, which generates an electric field 210 between itself and the receiver electrode 212. The transmitter 211 and receiver 212 electrodes effectively serve as the opposite plates of a capacitor, and the capacitance associated with the receiver electrode 212 is measured. In the example shown, the electrodes 211, 212 lie in the same plane (i.e. a horizontally-arranged mutually-capacitive sensor). In this configuration, the stray field lines 210 extend above the plane of the electrodes 211, 212 into the region above the insulator 209.

When the user's finger 207 or a stylus is brought into proximity of the sensor, the finger/stylus 207 interferes with the electric field 210 (i.e. the transmitter electrode 211 couples capacitively to the user/stylus 207). In this way, the capacitance associated with the receiver electrode 212 decreases (typically by 1 fF-5 pF). As with the self-capacitive touch sensor, the change in capacitance is detected. If the change exceeds a predetermined threshold value, the sensor interprets this as a touch input.

Figure 2C:
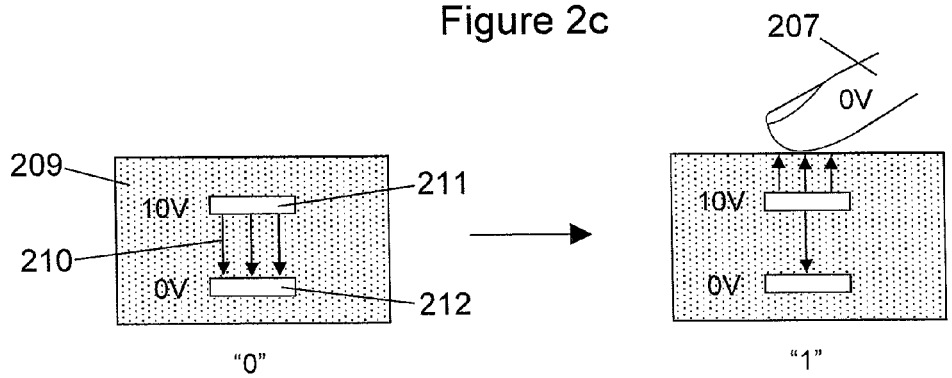
FIG. 2c shows the detection of a touch input by a vertically-arranged mutually-capacitive touch sensor.

To increase the resolution of a mutually-capacitive touch sensor array, the transmitter 211 and receiver 212 electrodes of each sensor may be arranged one on top of the other (i.e. a vertically-arranged mutually-capacitive sensor). This arrangement is illustrated in FIG. 2c. In this configuration, the user's finger/stylus 207 couples capacitively to the transmitter electrode 211 (similar to the electrode 208 of a self-capacitive sensor), causing a decrease in the capacitance associated with the receiver electrode 212.

By using an array of capacitive touch sensors, it is possible to pin-point the position of touch by averaging the signals from multiple sensors. This is useful when the touch input lies between adjacent sensors or spans multiple sensors. Whilst this allows the detection of touch inputs which lie between adjacent sensors, the detection tends to be more accurate when the position of touch coincides with the position of a sensor. For this reason, a greater density of sensors is usually advantageous.

As mentioned briefly in the background section, the integration of capacitive touchscreen and electrotactile technology presents various technical problems which must be overcome if these systems are to function properly in the same electronic display.

Figure 3A:
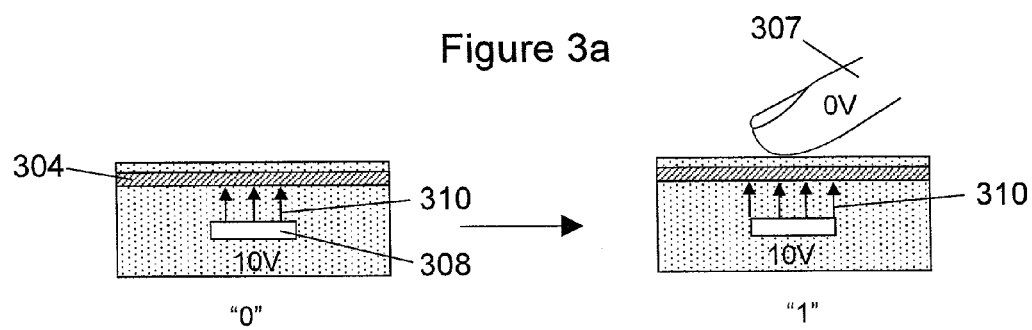
FIG. 3a shows how the presence of an electrotactile layer can hinder the detection of a touch input by a self-capacitive touch sensor.

FIG. 3a illustrates the scenario where an electrotactile system is integrated with self-capacitive touchscreen technology. As discussed above, an alternating voltage is applied to the electrotacile layer 304 when haptic feedback is required, and removed again when haptic feedback is not required. When the alternating voltage is not being applied, the electrotactile layer 304 may be grounded or floating. There are therefore moments in time when a potential difference exists between the capacitive touch sensors 308 and the electrotactile layer 304. In the examples illustrated, the electrotactile layer 304 is held at a floating potential (when the electrotactile layer in the "off" state) and a periodic potential is applied to the capacitive touch sensor electrodes 308 (with a peak amplitude of 10V). The potential difference results in capacitive cross-coupling between the capacitive touch sensor electrodes and the electrotactile layer 304, which is represented by electric field lines 310 in the figures.

Capacitive cross-coupling may prevent the detection of a touch input by the sensors. This is because the electrotactile layer 304 forms a capacitor with the sensor electrode 308 (compare FIG. 3a with FIG. 2a). As a result, the capacitance associated with the electrode 308 is relatively large before a touch input has been provided. When the user's finger 307 (or stylus) is then brought into proximity of the sensor, the capacitance associated with the electrode 308 increases, but the difference in capacitance is reduced by the presence of the electrotactile layer 304. This is depicted by an increase of one field line in FIG. 3a compared to an increase of three field lines in FIG. 2a. It is therefore more difficult for the system to distinguish between the "1" state and the "0" state as a result of the electrotactile layer 304.

Figure 3B:
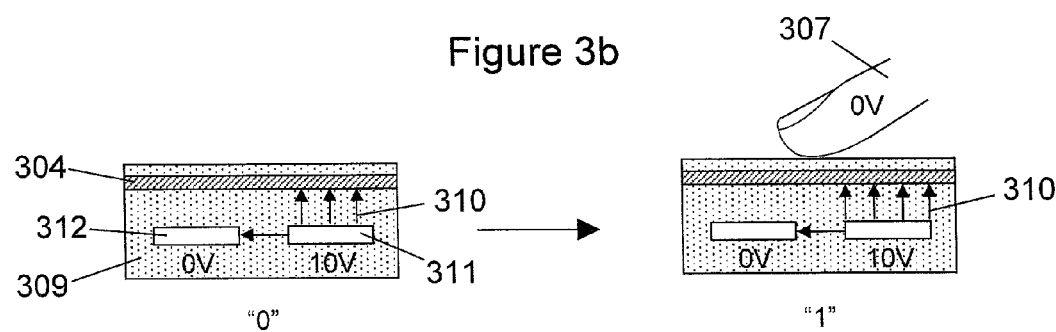
FIG. 3b shows how the presence of an electrotactile layer can hinder the detection of a touch input by a horizontally-arranged mutually-capacitive touch sensor.
Figure 3C:
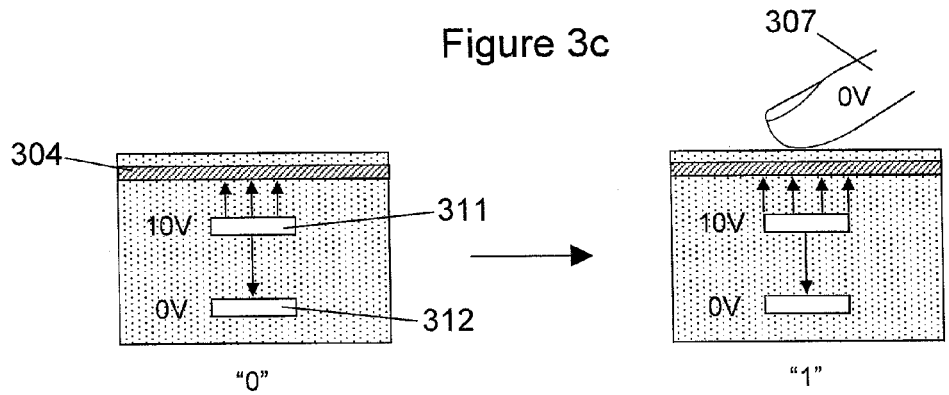
FIG. 3c shows how the presence of an electrotactile layer can hinder the detection of a touch input by a vertically-arranged mutually-capacitive touch sensor.

A similar scenario occurs when an electrotactile system is integrated with mutually-capacitive touch sensors. FIG. 3b shows a horizontally-arranged sensor whilst FIG. 3c shows a vertically-arranged sensor. In FIG. 3b, the stray field lines, which would normally extend beyond the electrical insulator 309, are intercepted by the electrotactile layer 304. As a result, the capacitance associated with the receiver electrode 312 is relatively small before a touch input has been provided. When the user's finger 307 (or stylus) is then brought into proximity of the sensor, the capacitance associated with the transmitter electrode 311 increases, but the decrease in capacitance associated with the receiver electrode 312 (which is used to determine whether or not a touch input has occurred) is negligible. This is depicted by a single field line between the transmitter 311 and receiver 312 electrodes before and during the touch input. The electrotactile layer has a similar effect on the vertically-arranged sensor of FIG. 3c.

Figure 4A:
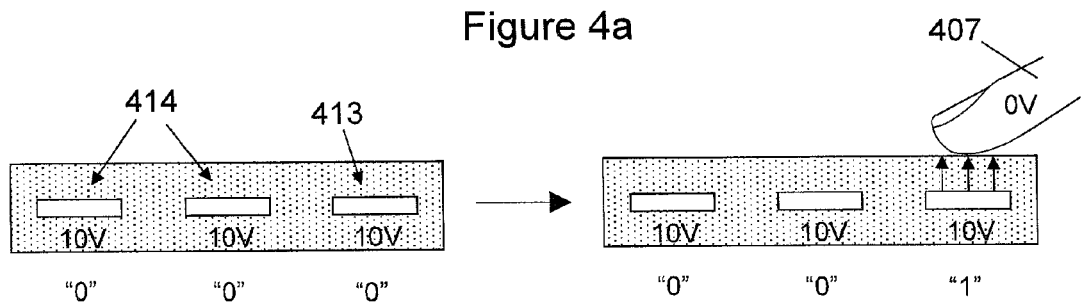
FIG. 4a shows a plurality of self-capacitive touch sensors.
Figure 4B:
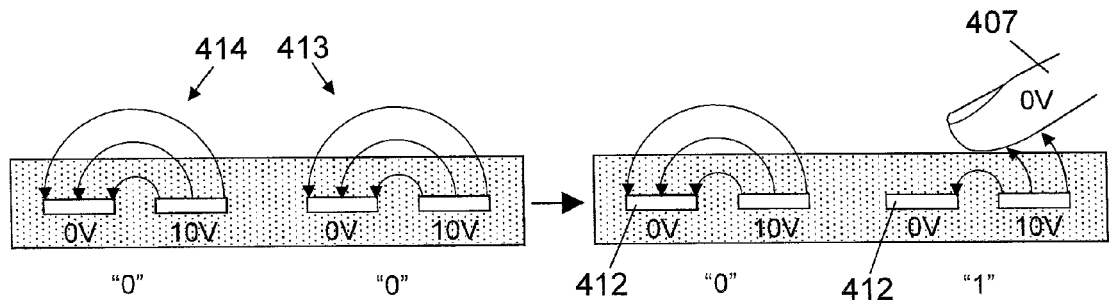
FIG. 4b shows a plurality of horizontally-arranged mutually-capacitive touch sensors.
Figure 4C:
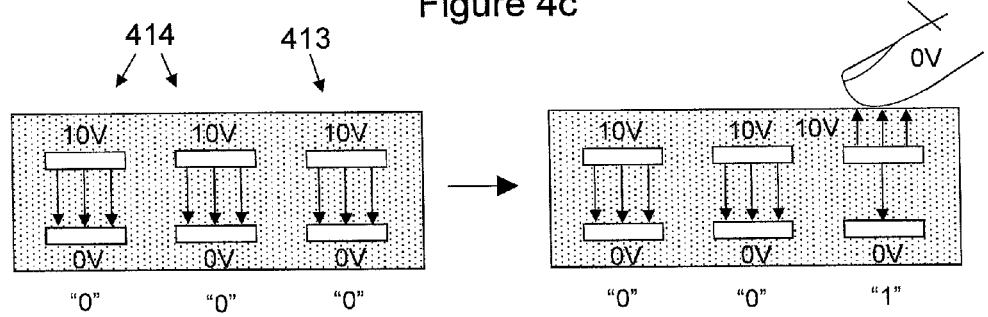
FIG. 4c shows a plurality of vertically-arranged mutually-capacitive touch sensors.

Capacitive cross-coupling can also lead to accidental triggering of other sensors 414 in the array when a touch input is applied to a first sensor 413. FIGS. 4a-4c illustrate how a plurality of touch sensors 413, 414 should operate under normal conditions (i.e. in the absence of an electrotactile layer). In FIG. 4a, the user's finger/stylus 407 causes an increase in capacitance at one of the self-capacitive sensors 413, but not the others 414.

As a result, the system detects a touch input at this sensor 413 only (i.e. the state switches from "0" to "1"). A similar scenario occurs with the mutually-capacitive touch sensors in FIGS. 4b and 4c, where the user's finger/stylus reduces the capacitance at the receiver electrode 412 of the right-hand sensor 413 but not at the receiver electrode 412 of the other sensor(s) 414.

Figure 5A:
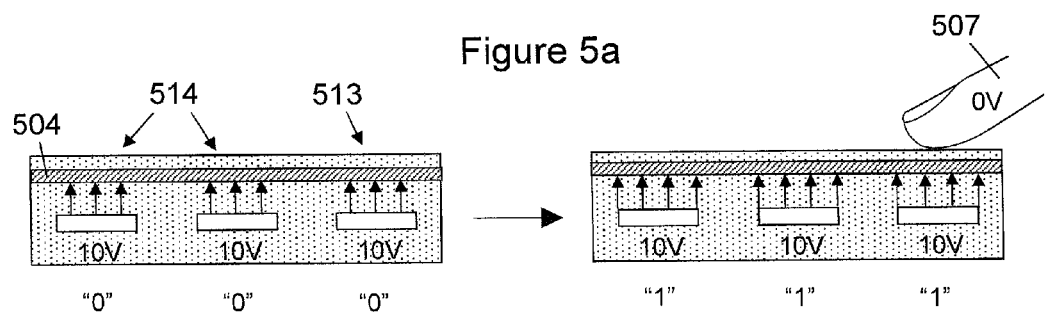
FIG. 5a shows how an electrotactile layer can cause accidental triggering of self-capacitive touch sensors.
Figure 5B:
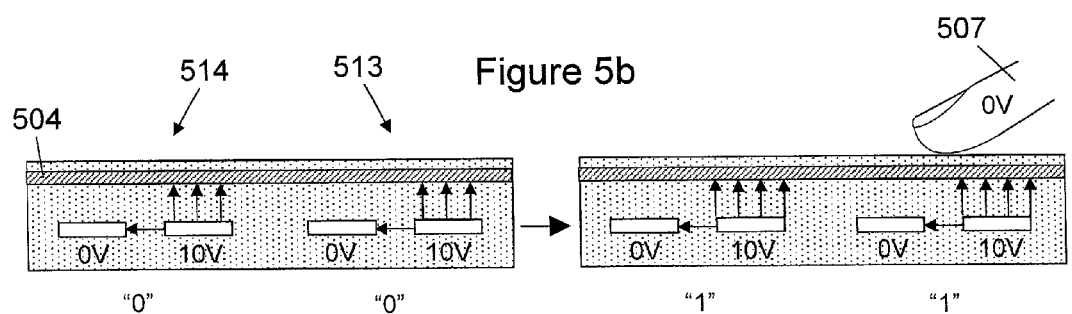
FIG. 5b shows how an electrotactile layer can cause accidental triggering of horizontally-arranged mutually-capacitive touch sensors.

FIGS. 5a-5c illustrate the effect of adding an electrotactile layer 504 to each of the different sensor arrays. When the user's finger/stylus 507 is brought into proximity of the right-hand sensor 513 in each case, the capacitance associated with this sensor 513 varies as expected. However, since each of the sensors 513, 514 are cross-coupled to each other via the electrotactile layer 504, the capacitance associated with the other sensors 514 also varies. In this way, a single touch input applied to one sensor 513 can also affect the state of the other sensors 514 (i.e. each sensor switches from the "0" state to the "1" state). In a touchscreen device, this problem may manifest itself as unintentional selection of onscreen content.

The above-mentioned issues may be addressed by including one or more apertures in the electrotactile layer. To achieve this, the dimensions, positioning and/or shape of the apertures are chosen to reduce the capacitive cross-coupling between the capacitive touch sensors and the electrotactile layer. Essentially, the apertures act to increase the distance between each sensor and the material which forms the electrotactile layer such that the capacitive cross-coupling causes a negligible variation in the capacitance of the sensors. The dimensions, positioning and/or shape of the apertures may be chosen such that the material used to form the electrotactile layer does not completely overlap with the underlying or overlying sensors. For example, the material used to form the electrotactile layer may partially overlap with the sensors (covering up to 10%, 25% or 50% of each sensor), or it may not overlap with the first sensor at all (i.e. none of the material used to form the electrotactile layer is located directly above or below the sensors). It is important in all embodiments, however, that the apertures do not prevent the electrotactile layer from providing haptic feedback to the user. In particular, the electrotactile layer should be able to provide haptic feedback to the user in response to a touch input.

FIGS. 6a and 6b illustrate two different configurations of electrotactile layer 604. In FIG. 6a, the electrotactile layer 604 comprises a plurality of circular apertures 615, whilst in FIG. 6b, the electrotactile layer 604 comprises a plurality of square apertures 616. In each configuration, the material of the electrotactile layer 604 forms a mesh-like structure. The apertures 615 may alternatively have an elliptical, diamond or trapezoidal shape. Instead of a mesh, the electrotactile layer may comprise a plurality of parallel or interdigitated strips, the gaps between adjacent strips constituting the apertures of the electrotactile layer. In this configuration, every second strip may be grounded to provide a potential difference between adjacent strips.

Each aperture 615 may be configured to reduce the capacitive cross-coupling between one sensor and the electrotactile layer 604, or may be configured to reduce the capacitive cross-coupling between multiple sensors and the electrotactile layer 604. Where the apertures are the gaps between parallel strips of material, each aperture may be configured to reduce the capacitive cross-coupling between one or more series of sensors and the electrotactile layer. The number of sensors affected by each aperture 615 may be controlled simply by varying the periodicity of the apertures.

The material used to form the electrotactile layer 604 may comprise conductive (e.g. a metal such as gold, silver or copper) or semiconductive (e.g. indium tin oxide or vanadium oxide) material. In addition, the electrotactile layer 604 may be formed as a thin film or as a network of silver, carbon or graphene nanowires.

Typically, the electrotactile layer 604 would be positioned above the sensor array and electronic display of the device (i.e. closest to the user) in order to provide sufficient haptic feedback to the user without excessive voltage and power consumption (although this is not essential). In this scenario, the material used to form the electrotactile layer 604 should be optically transparent to allow the user to see the underlying electronic display. The electrotactile layer 604 should also be separated from the user's finger/stylus and the underlying sensor array by layers of electrically insulating material in order to prevent a flow of current therebetween.

Figure 7B:
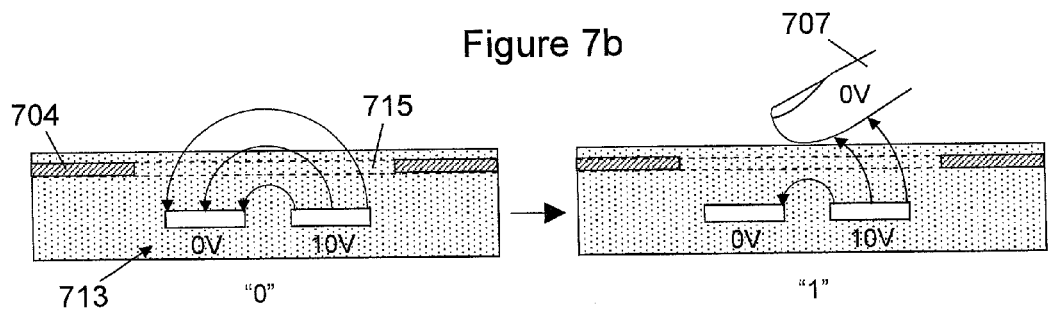
FIG. 7b shows how an aperture in an electrotactile layer can facilitate detection of a touch input by a horizontally-arranged mutually-capacitive touch sensor.
Figure 7C:
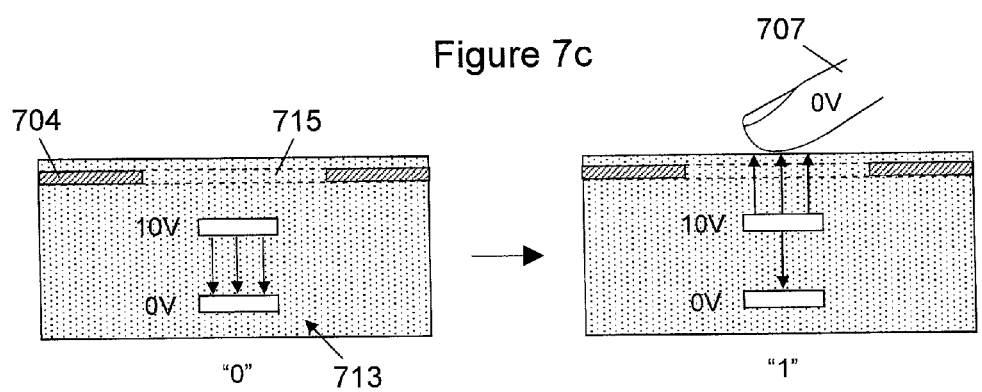
FIG. 7c shows how an aperture in an electrotactile layer can facilitate detection of a touch input by a vertically-arranged mutually-capacitive touch sensor.

FIGS. 7a-7c illustrate the effect of the apertures 715 on a single sensor 713. In each figure, the apertures 715 reduce capacitive cross-coupling between the sensor 713 and the electrotactile layer 704. In this way, the variation in sensor capacitance caused by the electrotactile layer 704 is negligible/manageable, thereby allowing the sensor 713 to function as though the electrotactile layer 704 was absent from the structure (i.e. similar behaviour to FIGS. 2a-2c).

It should be noted, however, that the size of the apertures in relation to the size of the finger/stylus in FIGS. 7 and 8 is exaggerated for illustrative purposes. As stated above, the electrotactile layer should be able to provide haptic feedback to the user in response to a touch input. In practice, therefore, the apertures should be small enough to allow the finger/stylus to bridge the gap between adjacent strips of the electrotactile layer. Quantitatively, this equates to a maximum aperture dimension ("x" in FIGS. 6a and 6b) of up to 2, 3, 4 or 5 mm (depending on the size of the sensors).

Furthermore, whilst the apertures are centred over the underlying sensors in FIGS. 7 and 8, this is only one possible arrangement. In practice, the apertures may be centred as shown, but they could be offset from this position provided that they are still able to reduce the capacitive cross-coupling between the sensors and the electrotactile layer.

Figure 8A:
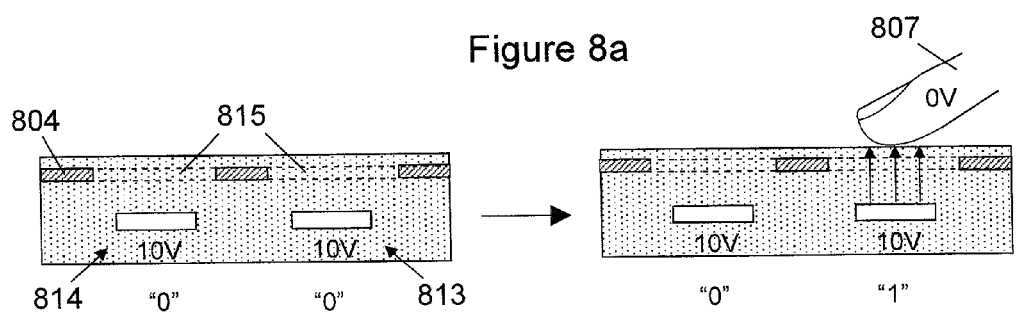
FIG. 8a shows how apertures in an electrotactile layer can prevent accidental triggering of self-capacitive touch sensors.

FIGS. 8a-8c illustrate the effect of the apertures 815 on a sensor array. In each figure, the apertures 815 reduce capacitive cross-coupling between the respective sensors 813, 814 and the electrotactile layer 804. In this way, the variation in capacitance caused by a touch input at the right-hand sensor 813 has little effect on the capacitance of the other sensor(s) 814, thereby preventing unintentional activation of the other sensor(s) 814 (i.e. similar behaviour to FIGS. 4a-4c).

Another problem encountered when capacitive touch-screen and electrotactile technology is integrated within the same device is that the electrotactile layer can induce charges on the capacitive touch sensors when the electrotactile layer is in the "on" state (i.e. when a potential is applied to the electrotactile layer to provide haptic feedback).

Figure 9A:
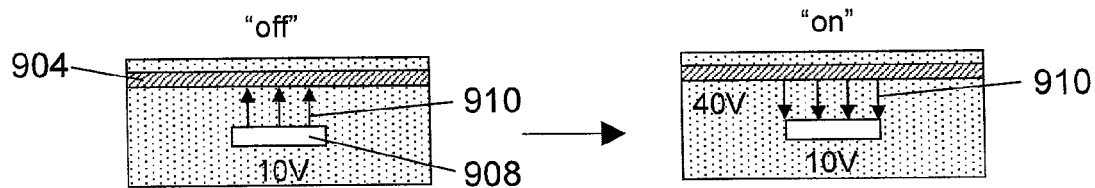
FIG. 9a shows a transfer of charge from an electrotactile layer to a capacitive touch sensor when the electrotactile layer is in the "on" state.

FIG. 9a shows the capacitive cross-coupling between the electrotactile layer 904 and a self-capacitive touch sensor 908 when the electrotactile layer 904 is in the "off" state and "on" state. In the "off" state, the electrotactile layer 904 is at a floating potential which is less than the periodic potential applied to the underlying sensor 908 (peak amplitude of 10V in this example). In this configuration, the sensor 908 induces charge on the electrotactile layer 904 as a result of the capacitive cross-coupling (illustrated by the electric field lines 910 from the sensor 908 to the electrotactile layer 904).

When the electrotactile layer 904 is in the "on" state, however, a periodic potential (with a peak amplitude of 40V in this example) is applied to the electrotactile layer 904 to provide haptic feedback to a user, which typically has a greater amplitude than the periodic potential applied to the underlying sensor 908 (10V in this example). In this configuration, the electrotactile layer 904 induces charge on the sensor 908 as a result of the capacitive cross-coupling (illustrated by the electric field lines 910 from the electrotactile layer 904 to the sensor 908). As a result of this charge transfer, the sensor 908 is incapable of inducing charge on a finger/stylus and therefore detecting a touch input. Furthermore, as a result of the large potential applied to the electrotactile layer 904 (relative to that applied to the sensor 908), the magnitude of charge induced on the sensor 908 can potentially damage the measurement circuit of the capacitive touch sensor 908. The same problems exist when horizontally or vertically arranged mutually-capacitive touch sensors (shown in FIGS. 3b and 3c) are used instead of self-capacitive touch sensors 908. Whilst the use of apertures in the electrotactile layer 904 may help to alleviate these problems by reducing the capacitive cross-coupling between the electrotactile layer 904 and the sensors 908, an additional or alternative solution may be required.

Figure 9B:
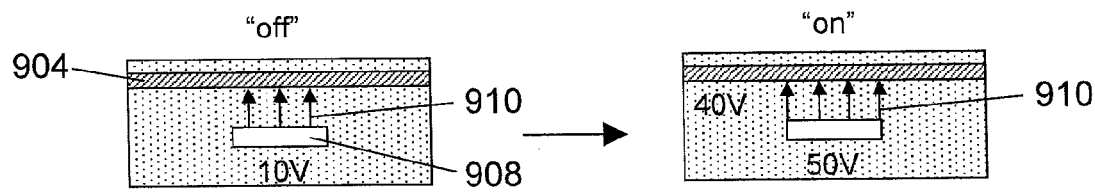
FIG. 9b shows how the transfer of charge from the electrotactile layer to the capacitive touch sensor can be reduced/prevented by applying a higher potential to the capacitive touch sensor than the electrotactile layer.

One technique which may be used to facilitate the detection of a touch input whilst the electrotactile layer 904 is in the "on" state is to apply a higher potential to the capacitive touch sensor 908 (50V peak amplitude in this example) than the electrotactile layer 904 (40V peak amplitude in this example), as shown in FIG. 9b. In this configuration, the capacitive touch sensor 908 induces charge on the electrotactile layer 904 as a result of the capacitive cross-coupling (i.e. the direction of charge transfer is reversed compared to the "on" state in FIG. 9a). This is illustrated by the electric field lines 910 from the capacitive touch sensor 908 to the electrotactile layer 904. The resulting electrostatic configuration is therefore similar to that of FIG. 3a where the electrotactile layer 904 is in the "off" state (i.e. held at a floating potential).

It is important that the potential 2235 applied to the capacitive touch sensor is consistently higher than the potential 2236 applied to the electrotactile layer when the capacitive touch sensor and electrotactile layer are in their respective "on" states at the same time. This may not be the case, however, if the periodic potentials 2235, 2236 have different frequencies or are out of phase with one another (as shown in FIG. 22a). In this scenario, there are moments in time when the electrotactile layer is at a higher potential than the capacitive touch sensor despite the fact that the potential 2235 applied to the capacitive touch sensor has a greater amplitude.

There are two ways to address this. The first option is to ensure that the frequency and phase of both potentials 2235, 2236 are substantially the same (whilst the potential 2235 applied to the capacitive touch sensor has a greater amplitude), as shown in FIG. 22b. The other option is to apply a DC offset ($V_{off}$) to the capacitive touch sensor such that the magnitude of the potential 2235 applied to the capacitive touch sensor is greater than the magnitude of the potential 2236 applied to the electrotactile layer (as shown in FIG. 22c) regardless of the frequency and phase of the potentials 2235, 2236.

Figure 9C:
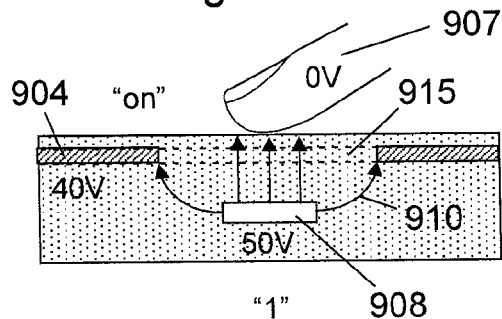
FIG. 9c shows how an aperture in an electrotactile layer can facilitate detection of a touch input by the capacitive touch sensor when the electrotactile layer is in the on state.

In order for the capacitive touch sensor 908 to couple to the user's finger/stylus 907 to enable the detection of a touch input, however, apertures 915 may also be required in the electrotactile layer 904 (as shown in FIG. 9c). Even with apertures 915 in the electrotactile layer 904, capacitive cross-coupling may still occur to some extent between the electrotactile layer 904 and the capacitive touch sensor 908, as indicated by the electric field lines 910.

The technique illustrated in FIGS. 9b and 9c can be implemented using an apparatus 1722 (shown in FIG. 17(a)) comprising at least one processor 1723 and at least one memory 1724 including computer program code. The apparatus 1722 is configured to control the states of the capacitive touch sensor 908 and electrotactile layer 904 by controlling the respective potentials applied to the capacitive touch sensor 908 and electrotactile layer 904. In particular, the apparatus 1722 is configured to place the capacitive touch sensor 908 in the "on" state (in which the capacitive touch sensor 908 is configured to enable the detection of a touch input) such that a first potential is applied to the capacitive touch sensor 908, and is configured to place the capacitive touch sensor 908 in the "off" state (in which the capacitive touch sensor 908 is not configured to enable the detection of a touch input) such that a second potential is applied to the capacitive touch sensor 908. Likewise, the apparatus 1722 is configured to place the electrotactile layer 904 in the "on" state (in which the electrotactile layer 904 is configured to enable the provision of haptic feedback) such that a third potential is applied to the electrotactile layer 904, and is configured to place the electrotactile layer 904 in the "off" state (in which the electrotactile layer 904 is not configured to enable the provision of haptic feedback) such that a fourth potential is applied to the electrotactile layer 904.

In order to reduce charge transfer from the electrotactile layer 904 to the capacitive touch sensor 908, therefore, the apparatus 1722 controls the first and third potentials such that the first potential is higher than the third potential (e.g. by applying a first periodic potential with a peak amplitude of +50V and a third periodic potential with a peak amplitude of +40V at the same frequency and phase) when the capacitive touch sensor 908 and electrotactile layer 904 are in their respective on states at the same time. Then, when haptic feedback is not required, the apparatus 1722 might ground the electrotactile layer 904, for example. A summary of example potentials (or their relative amplitudes) for the electrotactile layer 904 and capacitive touch sensor 908 are given in the table below.

| State | "on" | "off" |
|---|---|---|
| Electrotactile layer | +40 V (peak) | 0 V |
| Capacitive touch sensor | +50 V (peak) | 0 V |

One issue with applying a higher potential to the capacitive touch sensor 908 is the associated increase in power consumption, which can be an important consideration for battery-powered portable electronic devices. That said, the potential of the capacitive touch sensor 908 need only be increased when the electrotactile layer 904 is in the "on" state (i.e. when haptic feedback is required), so this aspect should not have much of an impact on battery life. The higher potential does, however, increase the amount of charge on the surface of the capacitive touch sensor 908, which as mentioned above, could potentially damage the measurement circuit.

Figure 10A:
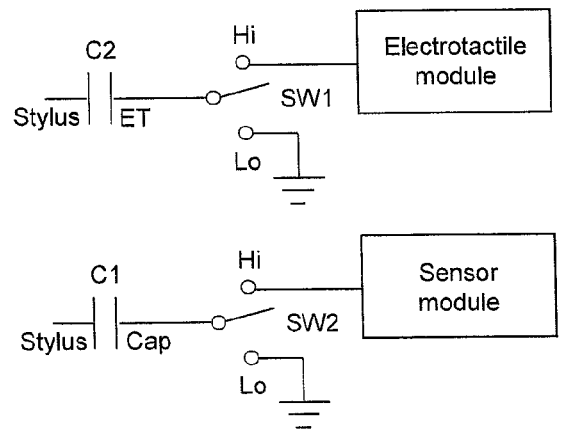
FIG. 10a shows how a series of switches can be used to reduce/prevent the transfer of charge from an electrotactile layer to a self-capacitive touch sensor.

Another option is to alternate operation of the electrotactile layer and the capacitive touch sensor(s) such that the sensors are switched "on" when the electrotactile layer is switched "off" and vice versa. FIG. 10a shows a possible circuit diagram for achieving this functionality in a device comprising a self-capacitive touch sensor and an electrotactile layer. The sensor electrode (Cap) and electrotactile layer (ET) each form capacitors (denoted C1 and C2) with a user's finger/stylus. This circuit comprises two switches (SW1 and SW2) which are operated simultaneously as follows.

When haptic feedback is required, switches SW1 and SW2 are set to "hi" and "low", respectively. In this configuration, the electrotactile layer (ET) is connected to an electrotactile module and the sensor electrode (Cap) is grounded (although it could be left floating instead). The electrotactile module comprises an electrotactile power supply, an electotactile control circuit, and a stylus ground. The electrotactile power supply is configured to apply a periodic voltage to the electrotactile layer, the electrotactile control circuit is configured to control the periodic voltage applied to the electrotactile layer (e.g. the amplitude, frequency, duration and/or polarity of the electrotactile signal), and the stylus ground is configured to ground the user/stylus when the user/stylus is in proximity to the electrotactile layer. The stylus ground is not absolutely necessary in order to feel the haptic feedback (because the user will act as a ground), but it may enhance the sensation. Furthermore, the stylus ground is not required when the electrotactile layer has an interdigitated configuration (as discussed previously) and every second strip is grounded.

When haptic feedback is not required, switches SW1 and SW2 are set to "low" and "hi" respectively. In this configuration, the sensor electrode (Cap) is connected to a sensor module and the electrotactile layer (ET) is grounded (although it could be left floating instead). The sensor module comprises a sensor power supply, a sensor control circuit, and a sensor measurement circuit. The sensor power supply is configured to apply a periodic voltage to the sensor electrode, the sensor control circuit is configured to control the periodic voltage applied to the sensor electrode, and the sensor measurement circuit is configured to measure the capacitance of the sensor electrode to determine whether or not a touch input has occurred (e.g. by comparing the measured capacitance or measured change in capacitance with a predetermined threshold value).

Since the capacitive touch sensor is switched "on" whilst the electrotactile layer is switched "off" (and vice versa), the high potential applied to the electrotactile layer does not affect operation of the sensor, and the charge transferred from the electrotactile layer to the sensor electrode is unable to damage the measurement circuit. Capacitive cross-coupling between the electrotactile layer and the capacitive touch sensor when the electrotactile layer is switched "off" (grounded or held at a floating potential), however, is still an issue, but this can be reduced using apertures in the electrotactile layer as described previously.

Figure 10B:
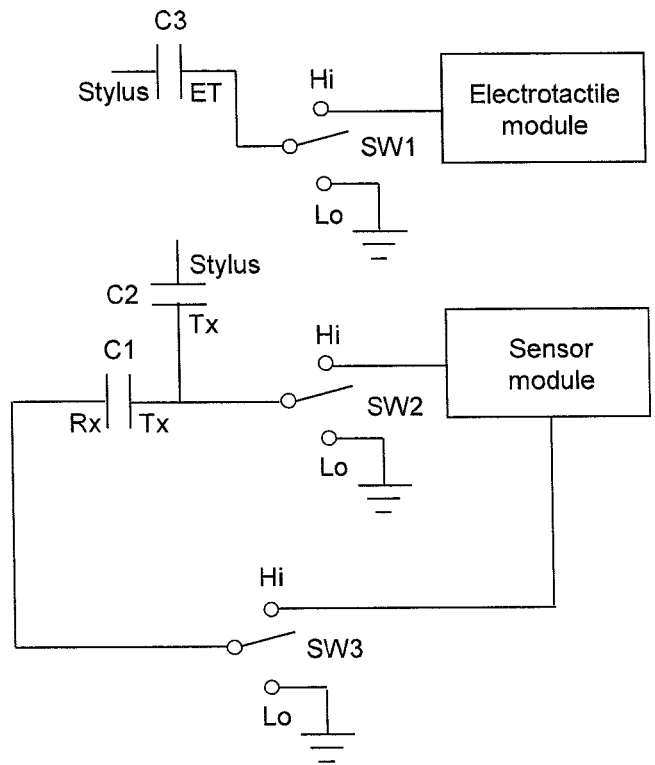
FIG. 10b shows how a series of switches can be used to reduce/prevent the transfer of charge from an electrotactile layer to a mutually-capacitive touch sensor.

FIG. 10b shows a similar circuit diagram for a device comprising a mutually-capacitive touch sensor and an electrotactile layer. In this case, the transmitter electrode (Tx) of the sensor forms one capacitor (denoted C1) with the receiver electrode (Rx) of the sensor, and another capacitor (denoted C2) with the user's finger/stylus. In addition, the electrotactile layer (ET) forms a third capacitor (denoted C3) with the user's finger/stylus. This circuit comprises three switches (SW1-SW3) which are operated simultaneously as follows.

When haptic feedback is required, switches SW1, SW2 and SW3 are set to "hi", "low", and "low", respectively. In this configuration, the electrotactile layer (ET) is connected to an electrotactile module (described above), whilst the transmitter (Tx) and receiver (Rx) electrodes are grounded (although they could be left floating instead). When haptic feedback is not required, switches SW1, SW2 and SW3 are set to "low", "hi", and "hi", respectively. In this configuration, the transmitter (Tx) and receiver (Rx) electrodes are connected to a sensor module (described above), whilst the electrotactile layer (ET) is grounded (although it could be left floating instead).

The circuit diagrams of FIGS. 10a and 10b show connections to a single sensor. However, the same principles may be applied to an array of sensors. This can be accomplished by multiplexing (not shown) the connection between switch SW2 and the sensor electrode (Cap) in FIG. 10a, and by multiplexing (not shown) the connection between switch SW2 and the transmitter electrode (Tx), and the connection between switch SW3 and the receiver electrode (Rx), in FIG. 10b.

Whilst the switches SW2 and SW3 in FIGS. 10a and 10b are used connect and disconnect the sensor electrodes from the entire sensor module, they could just be used to connect and disconnect the sensor electrodes from the sensor measurement circuit. This would prevent any charge transferred from the electrotactile layer to the capacitive touch sensors from damaging the measurement circuit.

Figure 11:
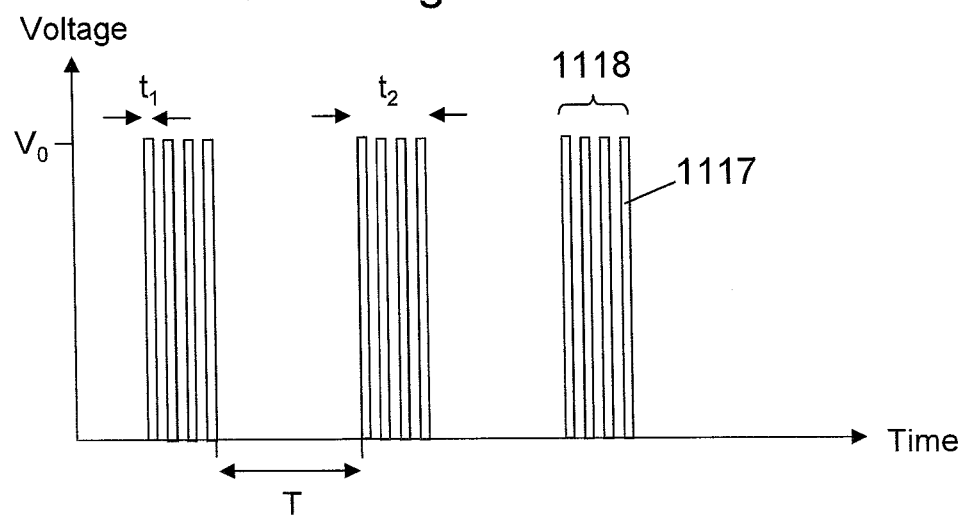
FIG. 11 shows a typical electrotactile signal for providing haptic feedback.

As shown in FIG. 11, the electrotactile signal for providing haptic feedback comprises a train of short, sharp pulses 1117 (with an amplitude $V_0$ and a typical duration $t_1$ of 10-50 μs) which are grouped together to form a basic pulse 1118 (with an amplitude $V_0$ and a typical duration $t_2$ of 0.5-2 ms). The frequency of the basic pulses 1118 is what determines the perceived frequency of vibration in the haptic feedback.

Measurement circuits for existing capacitive touch sensor arrays are capable of scanning the array (to determine whether a touch input has been applied or not) at a frequency of up to 1200 Hz, possibly higher. Scanning involves periodically applying a potential to each electrode of the array and measuring the capacitance associated with each electrode. Therefore, if the frequency of the basic electrotactile pulses 1118 is set to 10-500 Hz, there is a sufficient time window T for the measurement circuit to detect a touch input between voltage pulses. For example, if the basic electrotactile pulses 1118 have a frequency of 10 Hz, the measurement circuit could scan the sensor array up to 120 times in the time period (T). As a result, the capacitive touch sensors could also be used to detect touch inputs in the time between the basic pulses 1118. To achieve this, the switches shown in FIGS. 10a and 10b could be used to place the sensors in the "on" state when the electrotactile layer is in the "on" state between application of the basic pulses 1118.

The apparatus 1722 may use the switches shown in FIGS. 10a and 10b to control the respective states of the capacitive touch sensors and electrotactile layer. Using this circuitry, the apparatus 1722 could place the capacitive touch sensors in the "on" state by connecting them to the sensor module, and could place the capacitive touch sensors in the "off" state by connecting them to ground. Similarly, the apparatus 1722 could place the electrotactile layer in the "on" state by connecting it to the electrotactile module, and could place the electrotactile layer in the "off" state by connecting it to ground.

In this way, the apparatus 1722 could be used to reduce charge transfer from the electrotactile layer to the capacitive touch sensors by placing the capacitive touch sensors in the "on" state only when the electrotactile layer is in the "off" state. Since the third potential is a periodic potential (as shown in FIG. 11), the apparatus 1722 may be configured to place the capacitive touch sensor in the "on" state when the electrotactile layer is in the "on" state between application of the basic pulses 1118. Furthermore, since the potential of the electrotactile layer is lower between application of the basic pulses 1118, there is less risk of damage to the sensor measurement circuit during time period T.

Figure 12A:
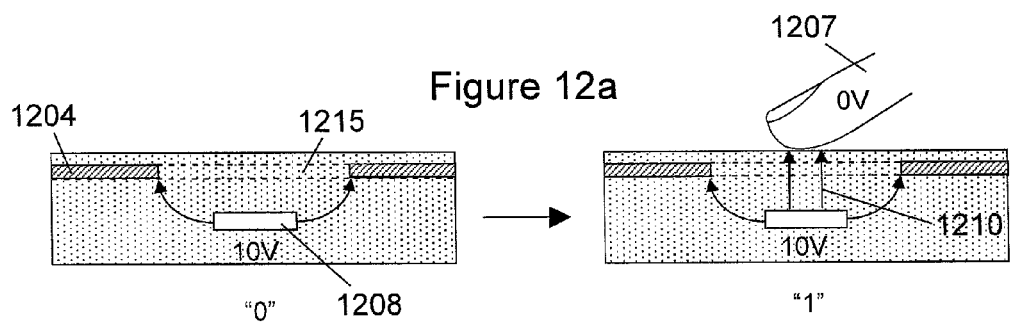
FIG. 12a shows how capacitive cross-coupling between a capacitive touch sensor and an electrotactile layer can hinder detection of a touch input despite the presence of an aperture in the electrotactile layer.

As mentioned above, capacitive cross-coupling between the electrotactile layer 1204 and the capacitive touch sensors 1208 may still occur to some extent even when the electrotactile layer 1204 comprises apertures 1215. Such capacitive cross-coupling could adversely affect operation of the sensor array when the electrotactile layer 1204 is in the "off" state. This is illustrated in FIG. 12a, where the capacitive coupling between the sensor 1208 and the user's finger/stylus 1207 is reduced (represented by only two electric field lines 1210 between the sensor 1208 and the user's finger/stylus 1207) as a result of the capacitive cross-coupling between the electrotactile layer 1204 and the capacitive touch sensor 1208.

Figure 12B:
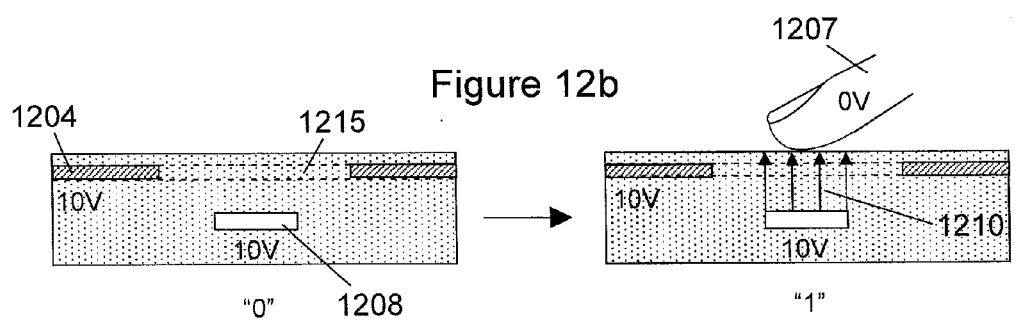
FIG. 12b shows how capacitive cross-coupling between the electrotactile layer and the capacitive touch sensor can be reduced/prevented by setting the electrotactile layer to the same potential as the capacitive touch sensor when the electrotactile layer is in the off state.

One technique for reducing the capacitive cross-coupling is to set the electrotactile layer 1204 to substantially the same potential as the sensor 1208 when the electrotactile layer 1204 is in the "off" state (i.e. when it is not being used to provide haptic feedback), as shown in FIG. 12b. This technique works because there is no potential difference between the electrotactile layer 1204 and the capacitive touch sensor 1208 and therefore no associated electric field. As a result, the sensor 1208 couples only to the user's finger/stylus 1207, which will typically be grounded. The sensor 1208 will therefore undergo a substantial (and readily detectable) increase in capacitance when the user's finger/stylus 1207 is positioned in proximity to the sensor 1208.

Apertures may, however, be required in order to prevent accidental activation of adjacent sensors caused by capacitive cross-coupling between the sensors via the electrotactile layer when a touch input is applied. An aperture 1215 is shown in FIGS. 12a and 12b, but need not necessarily be required to provide for reduced capacitive cross-coupling when the potential of the electrotactile layer 1204 and touch sensor 1208 are matched in the "off" state.

It is important that the amplitude, frequency and phase of the potential 2335 applied to the capacitive touch sensor is substantially the same as the amplitude, frequency and phase of the potential 2336 applied to the electrotactile later when the capacitive touch sensor is in the "on" state whilst the electrotactile layer is in the "off" state (as shown in FIG.

Figure 23A:
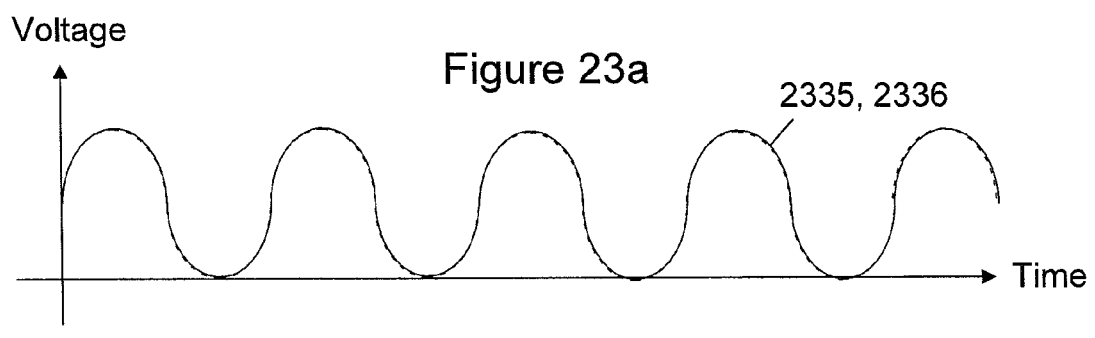
FIG. 23a shows periodic potentials having the same frequency, amplitude and phase.
Figure 23B:
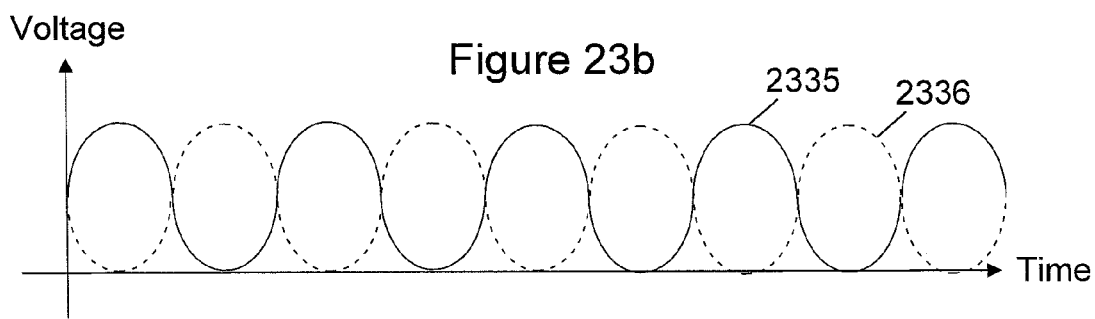
FIG. 23b shows periodic potentials having the same frequency and amplitude but different phases.

23a). If the amplitudes are equal but the signals are out of phase or their frequencies are different, there will be moments in time when the magnitude of the potential 2335 applied to the capacitive touch sensor is different to the magnitude of the potential 2336 applied to the electrotactile layer (as shown in FIG. 23b).

The technique illustrated in FIG. 12b can also be implemented using the apparatus 1722. The apparatus 1722 is configured to control the state of the capacitive touch sensor 1208 and electrotactile layer 1204 by controlling the respective potentials applied to the capacitive touch sensor 1208 and electrotactile layer 1204. In particular, the apparatus 1722 is configured to place the capacitive touch sensor 1208 in the "on" state (in which the capacitive touch sensor 1208 is configured to enable the detection of a touch input) such that a first potential is applied to the capacitive touch sensor 1208, and is configured to place the capacitive touch sensor 1208 in the "off" state (in which the capacitive touch sensor 1208 is not configured to enable the detection of a touch input) such that a second potential is applied to the capacitive touch sensor 1208. Likewise, the apparatus 1722 is configured to place the electrotactile layer 1204 in the "on" state (in which the electrotactile layer 1204 is configured to enable the provision of haptic feedback) such that a third potential is applied to the electrotactile layer 1204, and is configured to place the electrotactile layer 1204 in the "off" state (in which the electrotactile layer 1204 is not configured to enable the provision of haptic feedback) such that a fourth potential is applied to the electrotactile layer 1204.

In order to reduce capacitive cross-coupling between the capacitive touch sensor 1208 and the electrotactile layer 1204, therefore, the apparatus 1722 controls the first and fourth potentials such that they have substantially the same frequency, amplitude and phase (e.g. by applying first and fourth potentials with peak amplitudes of +10V at the same frequency and phase) when the capacitive touch sensor 1208 is in the "on" state whilst the electrotactile layer 1204 is in the "off" state. Then, when haptic feedback is required, the apparatus 1722 might apply a periodic potential to the electrotactile layer 1204 with a peak amplitude of +40V, for example. A summary of example potentials (or their relative amplitudes) for the electrotactile layer 1204 and capacitive touch sensor 1208 are given in the table below.

| State | "on" | "off" |
|---|---|---|
| Electrotactile layer | +40 V (peak) | +10 V (peak) |
| Capacitive touch sensor | +10 V (peak) | 0 V |

Figure 13A:
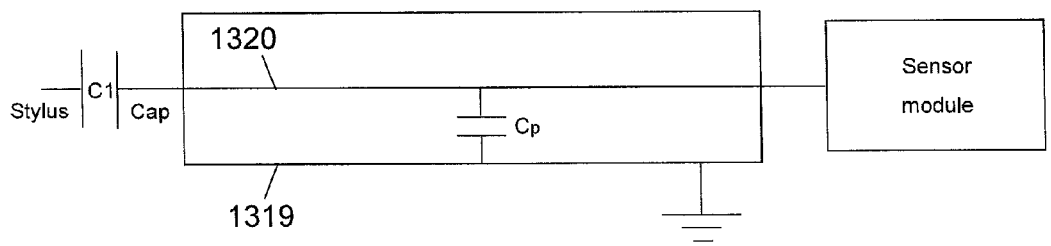
FIG. 13a shows a passive shield used to reduce the effects of electromagnetic interference on the signals of a capacitive touch sensor.
Figure 13B:
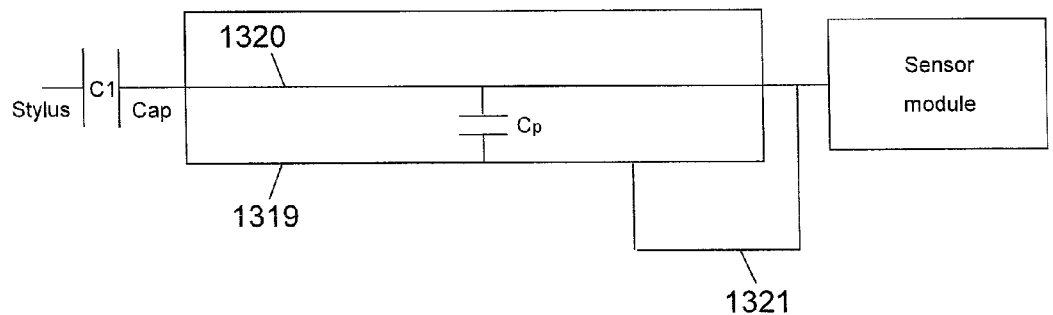
FIG. 13b shows an active shield used to reduce the effects of electromagnetic interference on the signals of a capacitive touch sensor.

To ensure that the first and fourth potentials are equal (to minimise the capacitive cross-coupling), the apparatus 1722 could use switch SW1 to connect the electrotactile layer 1208 to an active shield of the sensor array. The electrodes of a sensor array are often positioned at a different region of the device/apparatus than the sensor module because the electrodes need to be able to interact with the user's finger/stylus. As a result, the electrical signals transmitted to and from the electrodes are exposed to electromagnetic interference from other device circuitry. To reduce the electromagnetic interference to an acceptable level, the sensor electrodes tend to be connected to the sensor module by a coaxial or shielded wire/trace. There are two types of shielding: passive shielding and active shielding. With passive shielding, the outer conductor 1319 of the wire/trace is connected to ground, as shown in FIG. 13a. In this configuration, however, parasitic capacitance ($C_p$) between the inner 1320 and outer 1319 conductors is in parallel with the capacitance (C1) of the sensor electrode (Cap). If the level of parasitic capacitance (which is affected by environmental conditions) is large enough, it can adversely affect operation of the sensor array. With active shielding, on the other hand, the inner 1320 and outer 1319 conductors are connected via a feedback loop 1321, as shown in FIG. 13b. In this configuration, the inner 1320 and outer 1319 conductors are held at the same potential, so no parasitic capacitance exists between the two.

Figure 14:
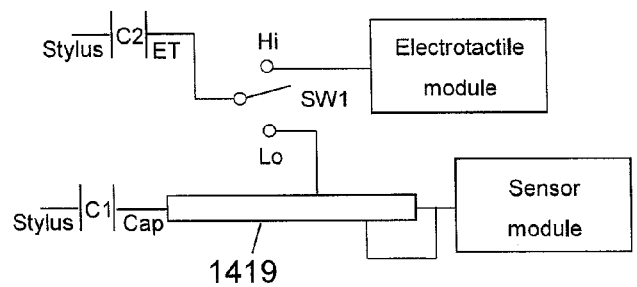
FIG. 14 shows how a switch can be used to connect an electrotactile layer to an active shield of a capacitive touch sensor when the electrotactile layer is in the off state.
Figure 15:
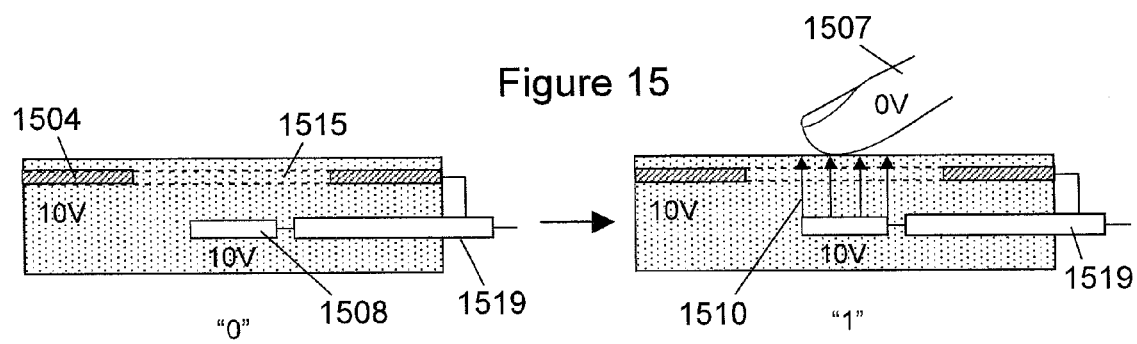
FIG. 15 shows how the connection of an electrotactile layer to an active shield of a capacitive touch sensor can reduce/prevent capacitive cross-coupling between the electrotactile layer and the capacitive touch sensor.

FIG. 14 shows how switch SW1 can be used to connect the electrotactile layer (ET) to the outer conductor 1419 of the active shield. Since the outer conductor 1419 is at the same potential as the inner conductor (and therefore at the same frequency, amplitude and phase as the sensor electrode (Cap)), no capacitive cross-coupling occurs between the electrotactile layer and the sensor when the electrotactile layer is in the "off" state and connected to the outer conductor 1419 (switch SW1 set to "low"). As can be seen in FIG. 15, this enables the sensor 1508 to couple solely to the user's finger/stylus 1507 (represented by four electric field lines 1510 between the sensor 1508 and the user's finger/stylus 1507), which facilitates detection of a touch input.

Instead of trying to reduce capacitive cross-coupling between the electrotactile layer and the capacitive touch sensors, another option is to manage the effects of the capacitive cross-coupling. As described with respect to FIGS. 5a-5c, accidental activation of adjacent sensors can occur when a touch input is applied as a result of capacitive cross-coupling between sensors via the electrotactile layer. This issue may be addressed by increasing the detection threshold of the sensors such that any increase in sensor capacitance as a result of the capacitive cross-coupling is insufficient to generate a touch input signal (i.e. is too small to be detected by the sensor measurement circuit).

Figure 16A:
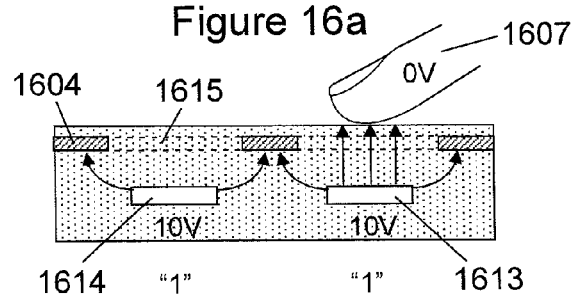
FIG. 16a shows how an electrotactile layer can cause accidental activation of capacitive touch sensors despite the presence of apertures in the electrotactile layer.

FIG. 16a shows the application of a touch input at the right-hand sensor 1613. In this example, the apertures 1615 are insufficient to completely prevent capacitive cross-coupling between the sensors 1613, 1614 and the electrotactile layer 1604. If the detection threshold (absolute capacitance or change in capacitance) of the sensors 1613, 1614 is set too low, the left-hand sensor 1614 may also be activated even though the user's finger/stylus 1607 is not in proximity to the left-hand sensor 1614. Activation of the left-hand sensor 1614 may result in the erroneous selection of onscreen content.

As an example, the detection threshold may initially be set such that a change in capacitance of 1 pF or more at any given sensor 1613, 1614 will be registered by the sensor measurement circuit as a touch input, thereby triggering the generation of a corresponding touch input signal. If the increase in capacitance at the right-hand sensor 1613 (which is in proximity to the user's finger/stylus 1607) as a result of the touch input is 5 pF, and the increase in capacitance at the left-hand sensor 1614 (which is not in proximity to the user's finger/stylus 1607) as a result of the capacitive cross-coupling is 1 pF, then touch input signals will be generated for both sensors 1613, 1614, as shown in FIG. 16a (i.e. the state of each sensor 1613, 1614 switches from a "0" to a "1"). On the other hand, if the detection threshold is increased such that a change in capacitance of 3 pF or more at any given sensor 1613, 1614 will be registered by the sensor measurement circuit as a touch input, then a touch input signal will only be generated for the right-hand sensor 1613 (as it should be), as shown in FIG. 16b (i.e. the state of the right-hand sensor 1613 switches from a "0" to a "1", but the state of the left-hand sensor does not).

Figure 16B:
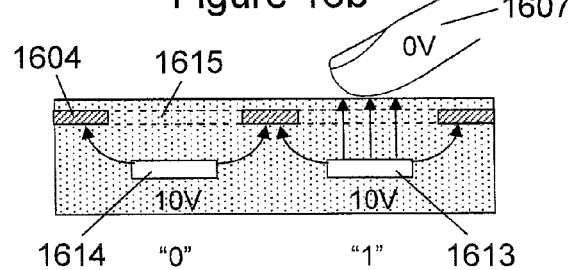
FIG. 16b shows how the accidental activation of capacitive touch sensors can be prevented by increasing the detection threshold of the capacitive touch sensors.

Whilst apertures 1615 are shown in FIGS. 16a and 16b, they are not necessarily required to prevent accidental activation of adjacent sensors 1613, 1614 if the detection threshold is increased. This is because the capacitance associated with the sensor in proximity to the user's finger/stylus 1607 (the right-hand sensor 1613 in FIGS. 16a and 16b) will be considerably greater than the capacitance associated with the other sensors (the left-hand sensor 1614 in FIGS. 16a and 16b) because of the capacitive coupling to the user's finger/stylus 1607.

The technique illustrated in FIG. 16b can also be implemented using the apparatus 1722. The apparatus 1722 is configured to set the detection threshold of one or more capacitive touch sensors 1613, 1614, and compare the capacitance associated with the sensors 1613, 1614 against the detection threshold to determine whether or not a touch input has occurred. In order to prevent accidental activation of a capacitive touch sensor 1613, 1614, therefore, the apparatus 1722 sets the detection threshold of the sensors 1613, 1614 to be sufficient to inhibit the erroneous generation of a touch input signal caused by capacitive cross-coupling.

The threshold set by the apparatus 1722 may be an absolute capacitance or a change in capacitance. In some embodiments, the apparatus 1722 may be configured to set the same detection threshold for each sensor, (FIG. 17(b)), whilst in other embodiments, the apparatus may be configured to set different detection thresholds for different sensors (FIG. 17(c)).

Furthermore, the detection threshold may be determined based on a peak capacitance associated with one or more sensors and filtering out lower capacitances associated with adjacent touch sensors (FIG. 17(d)). In this embodiment, the apparatus 1722 measures the capacitance associated with each sensor and compares the measured capacitances against one another. For a single touch input, there will typically be a maximum or peak capacitance (or change in capacitance) associated with the sensor in closest proximity to the user's finger/stylus, with lower capacitance (or change in capacitance) values associated with the other sensors as a result of direct (albeit weaker) coupling to the user's finger/stylus or capacitive cross-coupling to the electrotactile layer. For multiple touch inputs applied at the same time using multiple fingers/styluses, there will typically be multiple peaks associated with the sensors in closest proximity to the fingers/styluses. After comparing the capacitance values, the apparatus 1722 sets the detection threshold based on the peak capacitance, since this is the value corresponding to a touch input. The set threshold may be equal to the peak capacitance, or it may be a particular percentage of the peak capacitance (e.g. 70%, 80% or 90% of the peak capacitance) to allow for any variation in the behaviour/performance of the different sensors, or any variation between different touch inputs.

In another embodiment, the detection threshold may be determined using a calibration application configured to provide targets (or cross-hairs) associated with touch input (FIG. 17(e)). In this embodiment, the apparatus 1722 measures the capacitance (or change in capacitance) associated with a capacitive touch sensor lying beneath the target when the user's finger/stylus is in proximity to the target/sensor. The apparatus 1722 then sets the detection threshold according to the measured capacitance, since this is the value corresponding to a touch input. The set threshold may be equal to the measured capacitance, or it may be a particular percentage of the measured capacitance (e.g. 70%, 80% or 90% of the measured capacitance) to allow for any variation in the behaviour/performance of the different sensors, or any variation between different touch inputs.

FIG. 17(a) illustrates schematically the apparatus 1722 used to control the state of the electrotactile layer and capacitive touch sensors. It will be appreciated that this apparatus 1722 can be applied to the control of any aforementioned electrotactile layer and capacitive touch sensor (or respective arrays) with appropriate modifications. As described previously, the apparatus 1722 comprises a processor 1723 and a memory 1724 (or storage medium) including computer program code, which are electrically connected to one another by a data bus 1725. The apparatus 1722 also comprises the electrotactile layer 1704 and capacitive touch sensor(s) 1708 described herein. The apparatus 1722 may be an electronic device, a portable electronic device, a portable telecommunications device, a touchscreen display for any of the aforementioned devices, or a module for any of the aforementioned devices.

The capacitive touch sensors 1708, together with the processor 1723 and memory 1724, are configured to detect a touch input by a user of the apparatus 1722, whilst the electrotactile layer 1704, together with the processor 1723 and memory 1724, are configured to provide haptic feedback to the user. The haptic feedback may be in response to the detected touch input. The internal connections between the memory 1724 and processor 1723 can be understood to provide active coupling between the processor 1723 and memory 1724 to allow the processor 1723 to access the computer program code stored on the memory 1724.

The processor 1723 is configured for general operation of the apparatus 1722 by providing signalling to, and receiving signalling from, the other components to manage their operation. In particular, the processor 1723 is configured to set the voltages of the electrotactile layer 1704 and capacitive touch sensors 1708, and may be configured to monitor the capacitance associated with each sensor 1708.

The memory 1724 is configured to store computer code configured to perform, control or enable operation of the electrotactile layer 1704 and capacitive touch sensors 1708. The memory 1724 is also configured to store settings (including the operation voltages of the electrotactile layer 1704 and the capacitive touch sensors 1708) for the other components. The processor 1723 is able access the memory 1724 to retrieve the component settings in order to manage the operation of the other components. For example, the memory 1724 may store a predetermined threshold value for the capacitance of each sensor 1708. The processor 1723 may then compare the present capacitance of each sensor 1708 with the predetermined threshold to determine if a touch input has occurred. This may involve averaging the signals from multiple sensors to detect touch inputs that do not coincide with the position of a single sensor (e.g. the touch input lies between adjacent sensors or spans multiple sensors). In addition, the processor 1723 may run a corresponding piece of software (also stored in the memory 1724) in response to a detected touch input. The memory 1724 may be a temporary storage medium such as a volatile random access memory. On the other hand, the memory 1724 may be a permanent storage medium such as a hard disk drive, a flash memory, or a non-volatile random access memory.

The main steps 1826-1827 of a first method of using the apparatus described herein are illustrated schematically in FIG. 18; the main steps 1928-1930 of a second method of using the apparatus described herein are illustrated schematically in FIG. 19; and the main steps 2031-2033 of a third method of using the apparatus described herein are illustrated schematically in FIG. 20.

FIG. 21 illustrates schematically a computer/processor readable medium 2134 providing a computer program according to one embodiment. In this example, the computer/processor readable medium 2134 is a disc such as a digital versatile disc (DVD) or a compact disc (CD). In other embodiments, the computer/processor readable medium 2134 may be any medium that has been programmed in such a way as to carry out an inventive function. The computer/processor readable medium 2134 may be a removable memory device such as a memory stick or memory card (SD, mini SD or micro SD).

The computer program may comprise computer code configured to perform, control or enable:
  comparing the capacitance associated with a capacitive touch sensor of the array against a respective detection threshold to determine whether or not a touch input has occurred at the capacitive touch sensor by a stylus in capacitive coupling proximity to the capacitive touch sensor,
  wherein the detection threshold of one or more capacitive touch sensors of the array is set to be sufficient to inhibit the erroneous generation of a touch input signal at the one or more respective capacitive touch sensors caused by capacitive cross-coupling, via the electrotactile layer, to the capacitive touch sensor which is in capacitive coupling proximity to the stylus.

Additionally or alternatively, the computer program may comprise computer code configured to perform, control or enable one or more of:
  placing a capacitive touch sensor in an on state or an off state by controlling a potential applied to the capacitive touch sensor such that, in the on state, a first potential is applied to the capacitive touch sensor, and in the off state, a second potential is applied to the capacitive touch sensor, the capacitive touch sensor configured to enable the detection of a touch input when it is in the on state but not when it is in the off state; and
  placing an electrotactile layer, proximal to the touch sensor, in an on state or an off state by controlling a potential applied to the electrotactile layer such that, in the on state, a third potential is applied to the electrotactile layer, and in the off state, a fourth potential is applied to the electrotactile layer, the electrotactile layer configured to enable the provision of haptic feedback when it is in the on state but not when it is in the off state,
  wherein the first potential and fourth potential are periodic potentials, and wherein the first potential and fourth potential have substantially the same frequency, amplitude and phase when the capacitive touch sensor is in the on state whilst the electrotactile layer is in the off state to reduce capacitive cross-coupling caused by the proximity of the electrotactile layer to the capacitive touch sensor.

Additionally or alternatively, the computer program may comprise computer code configured to perform, control or enable one or more of:
  placing a capacitive touch sensor in an on state or an off state by controlling a potential applied to the capacitive touch sensor such that, in the on state, a first potential is applied to the capacitive touch sensor, and in the off state, a second potential is applied to the capacitive touch sensor, the capacitive touch sensor configured to enable the detection of a touch input when it is in the on state but not when it is in the off state; and
  placing an electrotactile layer, proximal to the capacitive touch sensor, in an on state or an off state by controlling a potential applied to the electrotactile layer such that, in the on state, a third potential is applied to the electrotactile layer, and in the off state, a fourth potential is applied to the electrotactile layer, the electrotactile layer configured to enable the provision of haptic feedback when it is in the on state but not when it is in the off state,
  wherein the first potential and third potential are periodic potentials, and wherein the first potential is higher than the third potential when the capacitive touch sensor and electrotactile layer are in their respective on states at the same time to reduce charge transfer from the electrotactile layer to the capacitive touch sensor caused by the proximity of the electrotactile layer to the capacitive touch sensor.

Other embodiments depicted in the figures have been provided with reference numerals that correspond to similar features of earlier described embodiments. For example, feature number 1 can also correspond to numbers 101, 201, 301 etc. These numbered features may appear in the figures but may not have been directly referred to within the description of these particular embodiments. These have still been provided in the figures to aid understanding of the further embodiments, particularly in relation to the features of similar earlier described embodiments.

It will be appreciated to the skilled reader that any mentioned apparatus/device and/or other features of particular mentioned apparatus/device may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some embodiments, a particular mentioned apparatus/device may be pre-programmed with the appropriate software to carry out desired operations, and wherein the appropriate software can be enabled for use by a user downloading a "key", for example, to unlock/enable the software and its associated functionality. Advantages associated with such embodiments can include a reduced requirement to download data when further functionality is required for a device, and this can be useful in examples where a device is perceived to have sufficient capacity to store such pre-programmed software for functionality that may not be enabled by a user.

It will be appreciated that any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

It will be appreciated that any "computer" described herein can comprise a collection of one or more individual processors/processing elements that may or may not be located on the same circuit board, or the same region/position of a circuit board or even the same device. In some embodiments one or more of any mentioned processors may be distributed over a plurality of devices. The same or different processor/processing elements may perform one or more functions described herein.

It will be appreciated that the term "signalling" may refer to one or more signals transmitted as a series of transmitted and/or received signals. The series of signals may comprise one, two, three, four or even more individual signal components or distinct signals to make up said signalling. Some or all of these individual signals may be transmitted/received simultaneously, in sequence, and/or such that they temporally overlap one another.

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

While there have been shown and described and pointed out fundamental novel features as applied to different embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. An apparatus comprising at least one processor and at least one memory including computer program code, the at least one memory and the computer program code configured to, with the at least one processor, cause the apparatus at least to, for an array of capacitive touch sensors with a proximally positioned electrotactile layer, wherein capacitive cross-coupling via the electrotactile layer increases sensor capacitance of the array of capacitive touch sensors, and wherein the electrotactile layer provides haptic feedback to a user and comprises one or more apertures formed in the electrotactile layer, wherein the apertures act to increase the distance between each sensor and a material which forms the electrotactile layer and a respective aperture of the one or more apertures has a location adjacent to a corresponding capacitive touch sensor of the array and is configured to reduce the capacitive cross-coupling, compare the capacitance associated with a corresponding capacitive touch sensor of the array against a respective detection threshold for the corresponding capacitive touch sensor to determine a touch signal depending on whether or not a touch input has occurred at the corresponding capacitive touch sensor by a stylus in capacitive coupling proximity to the corresponding capacitive touch sensor, wherein the respective detection threshold of the corresponding capacitive touch sensor is set to be different than another respective detection threshold of another capacitive touch sensor of the array to inhibit the erroneous generation of a touch input signal at said another capacitive touch sensor caused by the capacitive cross-coupling via the electrotactile layer when the capacitance associated with the corresponding capacitive touch sensor of the array is compared against the respective detection threshold.

2. The apparatus of claim 1, wherein the detection threshold is determined based on a peak capacitance associated with one or more sensors and filtering out lower capacitances associated with adjacent touch sensors.

3. The apparatus of claim 1, wherein the detection threshold is determined using a calibration application configured to provide targets associated with touch input.

4. The apparatus of claim 1, wherein the dimensions, positioning and/or shape of the one or more apertures reduce the capacitive cross-coupling.

5. The apparatus of claim 1, wherein the dimensions, positioning and/or shape of the one or more apertures are such that the material used to form the electrotactile layer does not completely overlap with any of the capacitive touch sensors.

6. The apparatus of claim 1, wherein the dimensions, positioning and/or shape of the one or more apertures are such that the electrotactile layer is able to couple capacitively to the stylus when the stylus is positioned to provide a touch input to a capacitive touch sensor.

7. The apparatus of claim 1, wherein the dimensions, positioning and/or shape of the one or more apertures are such that none of the material used to form the electrotactile layer is located directly above or below the capacitive touch sensors.

8. The apparatus of claim 1, wherein the dimensions, positioning and/or shape of the one or more apertures are such that the capacitive cross-coupling causes a negligible variation in the capacitance of the capacitive touch sensors.

9. The apparatus of claim 1, wherein the capacitive touch sensors are self-capacitive touch sensors each comprising a single electrode, the stylus forming a capacitor with the single electrode when the stylus is in proximity to the capacitive touch sensor, and wherein capacitive coupling between the capacitive touch sensor and the stylus causes a variation in the capacitance of the single electrode.

10. The apparatus of claim 1, wherein the capacitive touch sensors are mutually-capacitive touch sensors each comprising transmitter and receiver electrodes configured to generate an electric field therebetween, the stylus interfering with the electric field when the stylus is in proximity to the capacitive touch sensor, and wherein capacitive coupling between the capacitive touch sensor and the stylus causes a variation in the capacitance of the receiver electrode.

11. The apparatus of claim 1, wherein the electrotactile layer comprises a plurality of apertures, each aperture configured to reduce the capacitive cross-coupling between one capacitive touch sensor and the electrotactile layer.

12. The apparatus of claim 1, wherein each aperture is configured to reduce the capacitive cross-coupling between multiple capacitive touch sensors and the electrotactile layer.

13. The apparatus of claim 1, wherein the apparatus is one or more of the following: an electronic device, a portable electronic device, a portable telecommunications device, a touchscreen display for any of the aforementioned devices, and a module for any of the aforementioned devices.

14. A method comprising, for an array of capacitive touch sensors with a proximally positioned electrotactile layer, wherein capacitive cross-coupling via the electrotactile layer increases sensor capacitance of the array of capacitive touch sensors, and wherein the electrotactile layer provides haptic feedback to a user and comprises one or more apertures formed in the electrotactile layer, wherein the apertures act to increase the distance between each sensor and a material which forms the electrotactile layer and a respective aperture of the one or more apertures has a location adjacent to a corresponding capacitive touch sensor of the array and is configured to reduce the capacitive cross-coupling, comparing the capacitance associated with a corresponding capacitive touch sensor of the array against a respective detection threshold for the corresponding capacitive touch sensor to determine a touch signal depending on whether or not a touch input has occurred at the corresponding capacitive touch sensor by a stylus in capacitive coupling proximity to the corresponding capacitive touch sensor, wherein the respective detection threshold of the corresponding capacitive touch sensor is set to be different than another respective detection threshold of another capacitive touch sensor of the array to inhibit the erroneous generation of a touch input signal at said another capacitive touch sensor caused by the capacitive cross-coupling via the electrotactile layer when the capacitance associated with the corresponding capacitive touch sensor of the array is compared against the respective detection threshold.

15. A computer program, recorded on a non-transitory carrier, the computer program comprising computer code configured to perform the method of claim 14.

\* \* \* \* \*